(12) United States Patent
Vendt et al.

(10) Patent No.: US 10,672,758 B2
(45) Date of Patent: Jun. 2, 2020

(54) ELECTROSTATIC DISCHARGE PROTECTION STRUCTURE, METHOD FOR MANUFACTURING AN ELECTROSTATIC DISCHARGE PROTECTION STRUCTURE, AND VERTICAL THYRISTOR STRUCTURE

(71) Applicant: Infineon Technologies AG, Neubiberg (DE)

(72) Inventors: Vadim Valentinovic Vendt, Munich (DE); Stefan Pompl, Landshut (DE); Andre Schmenn, Sachsenkam (DE); Joost Willemen, Munich (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 141 days.

(21) Appl. No.: 15/787,124

(22) Filed: Oct. 18, 2017

(65) Prior Publication Data

US 2018/0108648 A1  Apr. 19, 2018

(30) Foreign Application Priority Data

Oct. 18, 2016 (DE) .................. 10 2016 119 813

(51) Int. Cl.
| | |
|---|---|
| H01L 27/02 | (2006.01) |
| H01L 29/66 | (2006.01) |
| H01L 29/06 | (2006.01) |
| H01L 29/87 | (2006.01) |
| H01L 29/74 | (2006.01) |

(52) U.S. Cl.
CPC ...... *H01L 27/0262* (2013.01); *H01L 29/0649* (2013.01); *H01L 29/66121* (2013.01); *H01L 29/66363* (2013.01); *H01L 29/7424* (2013.01); *H01L 29/87* (2013.01)

(58) Field of Classification Search
None
See application file for complete search history.

(56) References Cited

U.S. PATENT DOCUMENTS

| | | | | |
|---|---|---|---|---|
| 6,521,487 | B1 * | 2/2003 | Chen | H01L 27/0617 257/E21.389 |
| 6,956,266 | B1 * | 10/2005 | Voldman | H01L 21/76237 257/347 |
| 2005/0275032 | A1 | 12/2005 | Kodama et al. | |
| 2013/0032882 | A1 * | 2/2013 | Salcedo | H01L 27/0921 257/355 |

(Continued)

*Primary Examiner* — Evren Seven
(74) *Attorney, Agent, or Firm* — Slater Matsil, LLP

(57) ABSTRACT

According an embodiment, an electrostatic discharge protection structure includes: a semiconductor layer doped with a dopant of a first doping type, a first well region extending from a surface of the semiconductor layer into the semiconductor layer, wherein the first well region is doped with a dopant of a second doping type opposite the first doping type; a second well region next to the first well region and extending from the surface of the semiconductor layer into the semiconductor layer, wherein the second well region is doped with a dopant of the first doping type; an isolation structure extending from the surface of the semiconductor layer into the semiconductor layer with a depth similar to the depth of at least one of the first well region or the second well region, wherein the isolation structure is arranged laterally adjacent to the first well region and the second well region.

10 Claims, 26 Drawing Sheets

(56) References Cited

U.S. PATENT DOCUMENTS

| | | | |
|---|---|---|---|
| 2013/0153957 A1* | 6/2013 | Lin | H01L 27/0262 |
| | | | 257/147 |
| 2014/0015052 A1 | 1/2014 | Fenouillet-Beranger et al. | |
| 2014/0299912 A1* | 10/2014 | Lin | H01L 29/7424 |
| | | | 257/119 |
| 2015/0102384 A1* | 4/2015 | Zhan | H01L 27/0262 |
| | | | 257/173 |
| 2015/0279836 A1* | 10/2015 | Stockinger | H01L 27/0285 |
| | | | 361/56 |
| 2017/0098644 A1* | 4/2017 | Hong | H01L 27/0262 |

* cited by examiner

1210 — Forming an isolation structure into a semiconductor layer, the isolation structure extending from a surface of the semiconductor layer into the semiconductor layer, wherein the isolation structure laterally surrounds a first well region and a second well region and defines at least one trigger region, the at least one trigger region extending from the surface of the semiconductor layer into the semiconductor layer between the first well region and the second well region and between at least two regions of the isolation structure 1220 — n-type doping the first well region and p-type doping the second well region using the isolation structure as a doping mask

- 1410: Forming a layer stack, the layer stack including a first semiconductor layer doped with a dopant of a first doping type, a second semiconductor layer doped with a dopant of the first doping type, and a third semiconductor layer doped with a dopant of a second doping type opposite the first doping type, wherein the first semiconductor layer is disposed over the second semiconductor layer and wherein the second semiconductor layer is disposed over the third semiconductor layer

- 1420: Forming an isolation structure into the first semiconductor layer, the isolation structure extending from a surface of the first semiconductor layer into the first semiconductor layer, wherein the isolation structure laterally surrounds a first region

- 1430: Doping the first region with a dopant of the second doping type using the isolation structure as a doping mask

US 10,672,758 B2

ELECTROSTATIC DISCHARGE PROTECTION STRUCTURE, METHOD FOR MANUFACTURING AN ELECTROSTATIC DISCHARGE PROTECTION STRUCTURE, AND VERTICAL THYRISTOR STRUCTURE

This application claims priority to German Application No. 102016119813.7, filed on Oct. 18, 2016, which application is hereby incorporated herein by reference in its entirety.

TECHNICAL FIELD

Various embodiments relate generally to an electrostatic discharge protection structure, a method for manufacturing an electrostatic discharge protection structure, and a vertical thyristor structure.

BACKGROUND

In general, protection devices may be needed in semiconductor technology to provide protection against electrostatic discharge (ESD). Diodes, transistors, and/or thyristors may be used in conventional protection devices. ESD concepts may be provided on laterally integrated devices as well as on vertically integrated devices. Several test and simulation methods can be used for testing the susceptibility of an electronic device to ESD. The so called Human Body Model (HBM) may be used for testing ESD generated from human contact. Other ESD test models may be the Machine Model (MM), the System Level Model and the Charged-Device Model. The test may include discharging a charged capacitor through a resistor into an electrical terminal of the device under test. The test may be carried out according to the several commonly used ESD testing standards, as for example JEDEC 22-A114-B; IEC/EN 61000-4-2, ISO 10605, MIL-STD-883 Method 3015, and the ESD Association's ESD STM5.1. The ESD testing standards respectively specify a capacitance of the capacitor (e.g. 100 pF or 150 pF) and a resistance of the resistor (e.g. 1500Ω or 330Ω) used for testing the devices. However, other tests referring to similar standards may be applied.

SUMMARY

According to various embodiments, an electrostatic discharge protection structure is provided, the electrostatic discharge protection structure including: a semiconductor layer doped with a dopant of a first doping type, a first well region extending from a surface of the semiconductor layer into the semiconductor layer, the first well region doped with a dopant of a second doping type opposite the first doping type; a second well region next to the first well region and extending from the surface of the semiconductor layer into the semiconductor layer, the second well region doped with a dopant of the first doping type; and an isolation structure extending from the surface of the semiconductor layer into the semiconductor layer with a depth similar to the depth of at least one of the first well region or the second well region, the isolation structure arranged laterally adjacent to the first well region and the second well region.

BRIEF DESCRIPTION OF THE DRAWINGS

In the drawings, like reference characters generally refer to the same pails throughout the different views. The drawings are not necessarily to scale, emphasis instead generally being placed upon illustrating the principles of the invention. In the following description, various embodiments of the invention are described with reference to the following drawings, in which:

FIG. 12 shows a flow diagram of a method for manufacturing an electrostatic discharge protection structure, according to various embodiments;

FIG. 14 shows a flow diagram of a method for manufacturing a vertical thyristor structure, according to various embodiments.

DETAILED DESCRIPTION OF ILLUSTRATIVE EMBODIMENTS

Figure 1A:
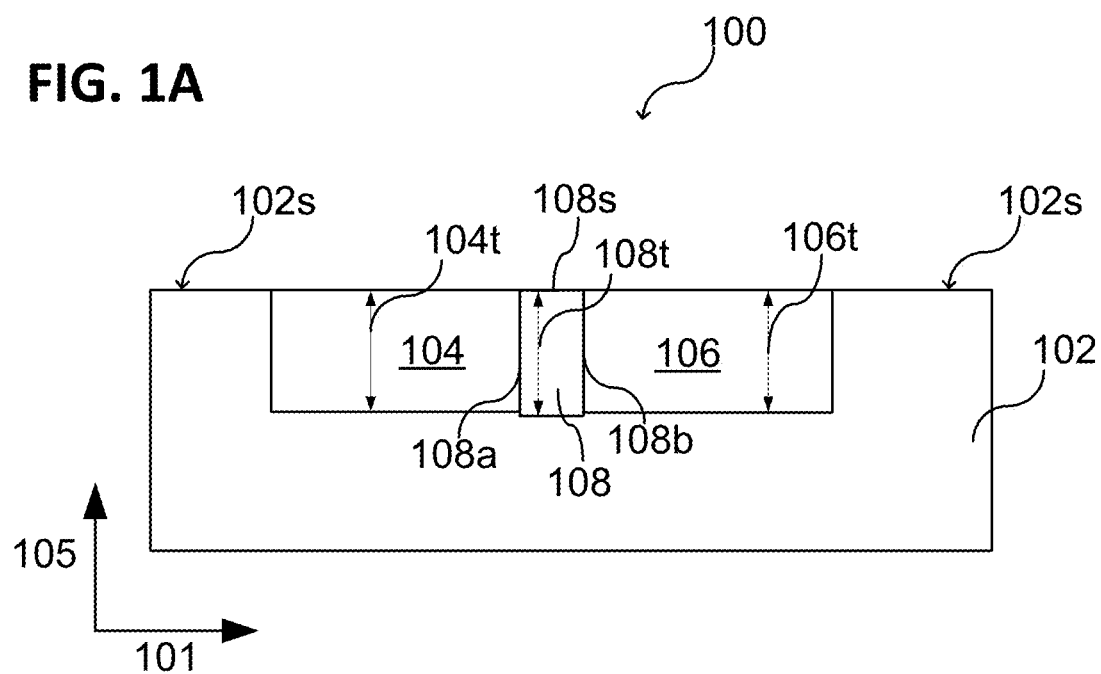
FIGS. 1A and 1B schematically show an electrostatic discharge protection structure in a cross-sectional view and in a top view, according to various embodiments.

The following detailed description refers to the accompanying drawings that show, by way of illustration, specific details and embodiments in which the invention may be practiced.

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments. Various embodiments are described in connection with methods and various embodiments are described in connection with devices. However, it may be understood that embodiments described in connection with methods may similarly apply to the devices, and vice versa.

The terms "at least one" and "one or more" may be understood to include any integer number greater than or equal to one, i.e. one, two, three, four, [ . . . ], etc. The term "a plurality" may be understood to include any integer number greater than or equal to two, i.e. two, three, four, five, [ . . . ], etc.

The terms "at least one of A or B" may be used herein to mean "A", "B", or "A and B", e.g. the logical and/or.

The word "over", used herein to describe forming a feature, e.g. a layer "over" a side or surface, may be used to mean that the feature, e.g. the layer, may be formed "directly on", e.g. in direct contact with, the implied side or surface. The word "over", used herein to describe forming a feature, e.g. a layer "over" a side or surface, may be used to mean that the feature, e.g. the layer, may be formed "indirectly on" the implied side or surface with one or more additional layers being arranged between the implied side or surface and the formed layer.

In like manner, the word "cover", used herein to describe a feature disposed over another, e.g. a layer "covering" a side or surface, may be used to mean that the feature, e.g. the layer, may be disposed over, and in direct contact with, the implied side or surface. The word "cover", used herein to describe a feature disposed over another, e.g. a layer "covering" a side or surface, may be used to mean that the feature, e.g. the layer, may be disposed over, and in indirect contact with, the implied side or surface with one or more additional layers being arranged between the implied side or surface and the covering layer.

The term "lateral" used with regards to the "lateral" extension of a structure (or of a structure element) provided on or in a carrier (e.g. a layer, a substrate, a wafer, or a semiconductor work piece) or "laterally" next to, may be used herein to mean an extension or a positional relationship along a surface of the carrier. That means that a surface of a carrier (e.g. a surface of a substrate, a surface of a wafer, or a surface of a work piece) may serve as reference, commonly referred to as the main processing surface. Further, the term "width" used with regards to a "width" of a structure (or of a structure element) may be used herein to mean the lateral extension of a structure. Further, the term "height" used with regards to a height of a structure (or of a structure element), may be used herein to mean an extension of a structure along a direction perpendicular to the surface of a carrier (e.g. perpendicular to the main processing surface of a carrier). Further, the term "depth" used with regards to a depth of a structure (e.g. a region), may be used herein to mean an extension of a structure along a direction perpendicular to the surface of a carrier (e.g. perpendicular to the main processing surface of a carrier). The term "thickness" used with regards to a "thickness" of a layer may be used herein to mean the spatial extension of the layer perpendicular to the surface of the support (the material or material structure) on which the layer is deposited. If a surface of the support is parallel to the surface of the carrier (e.g. parallel to the main processing surface) the "thickness" of the layer deposited on the surface of the support may be the same as the height of the layer.

The term "coupled" is used herein to mean electrically connected, which may include a direct connection or an indirect connection, wherein an indirect connection may only include additional structures in the current path that not influence the substantial functioning of the described circuit or device. The term "electrically conductively connected" that is used herein to describe an electrical connection between two terminals, two contacts, etc. may be understood as an electrically conductive connection with ohmic behavior, e.g. provided by a metal or degenerate semiconductor in absence of p-n junctions in the current path. The term "contacted" that is used herein to describe an electrical contact between a metallization and a semiconductor contact region, or the like, may be understood as direct physical and/or direct electrical contact.

The term "region" used with regards to a "doped region", a "contact region", and the like, may be used herein to mean a continuous region of a single doping type. Different regions disposed within a carrier (e.g. within a semiconductor layer) may be identified and/or distinguished from the carrier based on their doping type and/or doping concentration.

The term "similar" used with regards to a depth (or a spatial extension) may be used herein to mean substantially equal, e.g. with a deviation of less than 50%, e.g. less than 40%, e.g. less than 30%, e.g. less than 20%, or even less than 10%.

According to various embodiments, a semiconductor layer (e.g. a semiconductor substrate, a semiconductor wafer, a deposited semiconductor layer, an epitaxial semiconductor layer, and the like) may be made of or may include silicon. However, other semiconductor materials of various types may be used in a similar way, e.g. germanium, Group III to V (e.g. SiC), or other types, including for example polymers. In an embodiment, the semiconductor layer is a wafer made of silicon (e.g. p-type doped or n-type doped). In an alternative embodiment, the semiconductor layer is a silicon on insulator (SOI) wafer.

The term first doping type and second doping type may be used herein to mean opposite doping types. The first doping type may be n-type and the second doping type may be p-type. Vice versa, the first doping type may be p-type and the second doping type may be n-type.

According to various embodiments, a region, as described herein, may be a portion of a semiconductor carrier, e.g. of a semiconductor wafer or a semiconductor layer. A semiconductor layer may be a portion of a semiconductor wafer or may be an epitaxial layer formed over any suitable carrier, e.g. over a semiconductor wafer.

The term "vertical" used with regards to a "vertical" electronic structure (e.g. a vertical thyristor structure or a vertical device) may be used herein to mean that an electrical current, e.g. an ESD current, may flow substantially vertically through the electronic structure, e.g. from a first side of the electronic structure to a second side of the electronic structure opposite the first side. The term "lateral" used with regards to a "lateral" electronic structure (e.g. a lateral thyristor structure or a lateral device) may be used herein to mean that an electrical current, e.g. an ESD current, may flow substantially laterally through the electronic structure, e.g. from a first side of the electronic structure through the electronic structure again to the first side of the electronic structure.

The term "protection structure" used with regards to an electrostatic discharge "protection structure" may be used herein to mean that the protection structure may have at least two terminals, e.g. two electrical contacts, for coupling the protection structure to an electronic device to be protected. An electronic device to be protected may include an electronic circuit, and, for example, a first bus (e.g. a supply bus) and a second bus (e.g. a ground bus) to operate the electronic circuit. The protection structure may be coupled between the first bus and the second bus, e.g. in parallel to the electronic circuit, to divert an ESD current through the protection structure. An electronic device to be protected may also have an Input/Output-(I/O)-pad coupled to the electronic circuit, wherein the protection structure may be coupled to the I/O-pad, e.g. between the I/O-pad and at least one bus, to divert an ESD current through the protection structure. The ESD protection structure may be configured to allow a substantial current flow through the protection structure only in case of an ESD event to not influence the default operation of the electronic device.

In general, due to further reduction in technology feature size the I/O chipsets for today's device I/O ports like Audio connection, USB, Thunderbolt, HDMI, etc., are getting more and more susceptible to over voltage/electro-static-discharge damage. To further reduce the clamping voltage at the Electrostatic Discharge (ESD) paths, Silicon Controlled Rectifier (SCR, also referred to as thyristor) based discrete ESD devices will get increasingly important in the future. Due to the deep snap back (latching) of the thyristor and the high performance of the device the highest voltage that will be seen by the circuit to be protected is the device trigger voltage. Additionally, the capacitance of an ESD protection device may be as small as possible to ensure, for example, signal integrity in high-speed data interfaces. This requirement forces device designers conventionally to shrink their ESD device area, which might result in insufficient protection performance. According to various embodiments, an ESD protection structure is provided further reducing the overall device capacitance and at the same time fulfilling the required ESD protection performance. The ESD protection structure provided herein may have a very low capacitance per well area, e.g. less than about 0.05 fF/$\mu m^2$.

Triggering of an SCR structure at low voltages (e.g. less than about 8 V) may be realized conventionally by adjusting the internal collector-base avalanche-breakdown voltage. This may require high doping levels which have an adverse impact on the device capacitance. The blocking characteristic of a conventional pnpn-structure for negative ESD discharge currents may be undesired for ESD protection since negative ESD stress cannot be protected without an additional bypassing structure.

A conventionally used SCR structure for system level ESD protection may be provided based on mainly two concepts that may combine low device capacitance and a low voltage triggering with high system level ESD robustness. A first concept may base one a vertical SCR including a PIN (p type doped, intrinsic, n type doped) configuration for the p emitter junction. A second concept may base on a lateral SCR including two alternating well implants into a low-doped p-silicon substrate and two alternating contact implants into each well region. The SCR capacitance will be primarily determined by the n well to the p substrate junction because a wide space-charge-region will be formed into the low-doped p-substrate. Conventionally used SCR structures may include isolation structures for separating electrical contacts of the SCR structures. However, this may not substantially reduce the device capacitance since a dominating part of the capacitance may be caused by well regions generating junctions that extend deeply into the substrate.

According to various embodiments, a lateral thyristor structure may be provided, the lateral thyristor structure including an n well and a p-well being arranged laterally next to each other. The lateral thyristor structure may be realized as finger structure and can be scaled by length to achieve the needed system level ESD robustness. The lateral thyristor structure may include an isolation structure that encloses the n-well and/or the p-well at least partially. The isolation structure may have substantially the same depth as the n-well and/or the p-well. The isolation structure may be a shallow trench isolation (STI) or any other suitable isolation structure.

According to various embodiments, a perimeter capacitance of an n-well is reduced by using an isolation structure and (especially in the case of a nearby p-well) the capacitance between the n-well and the p-well is reduced due to the fact that the isolation structure disposed between the wells includes or consists of silicon oxide (or any other low-k dielectric material) that has a significantly lower dielectric constant than semiconductor material used in conventional structures without an isolation structure.

According to various embodiments, trigger regions, which have a locally reduced breakdown voltage between the p-well and n-well, can be defined by gaps in the isolation structure separating the n-well from the p-well. In these trigger regions the breakdown voltage can be defined by the doping profile and mask distance or overlap between the implantation of the n-well and the p-well region. According to various embodiments, a trigger implant may be introduced which is minimized in capacitance per area. Further, the junction capacitance of the well region may be reduced by using the lowest possible substrate doping.

According to various embodiments, an implantation of a p-plus doped region may be used in the trigger region (as also used for the p-well contact and the anode region in the n well) with an appropriate distance or overlap to the n-well region. Alternatively, an implantation of an n plus doped region may be used in the trigger region (as also used for the n-well contact and the cathode region in the p-well) with an appropriate distance or overlap to the p-well region. According to various embodiments, an n-plus region and a p-plus region may be formed in the trigger region with appropriate distance or overlap to each other. Instead of either or both the above-mentioned n-plus region or p-plus region, dedicated n-type and/or p-type implantation steps may be used to provide the appropriate trigger behavior.

According to various embodiments, by an adjustment of the layout and/or dopant profiles in the trigger regions the trigger voltages can be varied in a wide range (e.g. from about 7 V to about 8 V for USB3.x, from about 18 V to about 26 V for an NFC antenna, from about 8 V to about 18 V for touch screen controller, and any other desirable voltage that is below the n-well to p-well breakdown voltage of the wells without trigger regions.

According to various embodiments, by adjusting the width and the amount of the trigger regions (i.e. by adjusting the number and width of the gaps in the isolation structure) the contribution of the trigger regions to the total device capacitance and the series resistance associated with the trigger breakdown device can be adjusted. More and/or wider trigger regions increase the capacitance and reduce the series resistance (cf. FIG. 2C). Another benefit of the trigger regions provided by gaps in the isolation structure may be the (e.g. partial) self-alignment of the doped regions if the sides of the trigger regions are formed by the isolation structure sidewalls, as described herein.

FIG. 1A illustrates an electrostatic discharge (ESD) protection structure boo in a schematic cross-sectional view, according to various embodiments. The ESD protection structure 100 includes a semiconductor layer 102 doped with a dopant of a first doping type. Further, the ESD protection structure boo includes a first well region 104 extending from a surface 102s of the semiconductor layer 102 into the semiconductor layer 102. The first well region 104 is doped with a dopant of a second doping type opposite the first doping type. Further, the ESD protection structure boo includes a second well region 106 next to the first well region 104 and extending from the surface 102s of the semiconductor layer 102 into the semiconductor layer 102. The second well region 106 is doped with a dopant of the first doping type. Illustratively, the ESD protection structure boo includes two laterally adjacent well regions 104, 106 of opposite doping types. The two laterally adjacent well regions 104, 106 may be provided to directly contact each other or, alternatively, spaced apart from each other.

According to various embodiments, the ESD protection structure 100 includes an isolation structure 108 extending from the surface 102s of the semiconductor layer 102 into the semiconductor layer 102 with a depth 180t similar to the depth 104t, 106t of at least one of the first well region 104 or the second well region 106. In other words, the first well region 104 may extend into the semiconductor layer 102 with a first depth 104t, the second well region 106 may extend into the semiconductor layer 102 with a second depth 106t, and the isolation structure 108 may extend into the semiconductor layer 102 with a third depth 108t. The first depth 104t may substantially equal the second depth 106t. Alternatively, the first depth 104t may be greater than the second depth 106t. The third depth 108t may substantially equal the first depth 104t and/or may substantially equal the second depth 106t. Therefore, the isolation structure 108 may laterally separate the first well region 104 from the second well region 106. However, a sufficiently high electrical current flow may be allowed between the first well region 104 and the second well region 106 through the semiconductor layer 102.

According to various embodiments, the isolation structure 108 may be arranged laterally adjacent to both the first well region 104 and the second well region 106. The isolation structure 108 may have a surface 108s exposed at the surface 102s of the semiconductor layer 102. Further, the isolation structure 108 may have a first sidewall 108a contacting or facing the first well region 104. Further, the isolation structure 108 may have a second sidewall 108b contacting or facing the second well region 106.

According to various embodiments, the semiconductor layer 102 may include or may consist of silicon, e.g. single crystalline silicon, or any other suitable semiconductor material. The semiconductor layer 102 may be a part of a semiconductor wafer or may be an epitaxially grown semiconductor layer 102.

According to various embodiments, the isolation structure 108 may include or may consist of an electrically insulating material, e.g. silicon oxide, or any other suitable electrically insulating material. The isolation structure 108 may include or may be a shallow trench isolation (STI).

A low capacity for the ESD protection structure 100 may be provided by selecting the electrically insulating material of the isolation structure 108 to have a low first relative permittivity ($\varepsilon_r$). Illustratively, the isolation structure 108 may include low-k dielectric material, or at least a dielectric material having less relative permittivity than the semiconductor material of the semiconductor layer 102 surrounding the well regions 104, 106. Illustratively, in the case the semiconductor layer 102 is a silicon layer, the isolation structure 108 may include or may be made of a dielectric material having less relative permittivity than silicon, e.g. less than about 3.6.

According to various embodiments, an STI (or any other isolation structure 108) may be used to cut out high capacitive well-to-well junction area and to reduce the overall border capacitance. As an example, the STI may remove more than 90% of the junction between the wells 104, 106. The STI capacitance will be less than the capacitance of intrinsic semiconductor material (e.g. intrinsic silicon) between the wells 104, 106, since, for example, $\varepsilon_{Si}$ is greater than $\varepsilon_{(SiOx)}$. According to various embodiments, the STI may be deeper than the first well region 104 that has the opposite doping type compared to the semiconductor layer 102.

According to various embodiments, the semiconductor layer 102 may be a low doped semiconductor layer 102, e.g. with a dopant concentration of equal to or less than about 1e14 cm-3.

According to various embodiments, the depths 140t, 106t, 108t of the well regions 104, 106 and of the isolation structure 108 may be measured (without loss of generality) along a vertical direction 105 that is perpendicular to the surface 102s of the semiconductor layer 102. The well regions 104, 106 are arranged laterally next to each other providing a lateral ESD protection structure 100. The lateral ESD protection structure 100 may be configured to provide a substantial current flow along a lateral direction 101 perpendicular to direction 105. According to various embodiments, the isolation structure 108 may be used to control the well-to-well breakdown voltage, e.g. providing one or more trigger regions between the wells 104, 106 and by adjusting the properties (e.g. the doping, the geometry, etc.) of the one or more trigger regions (cf. FIG. 2C).

Figure 1B:
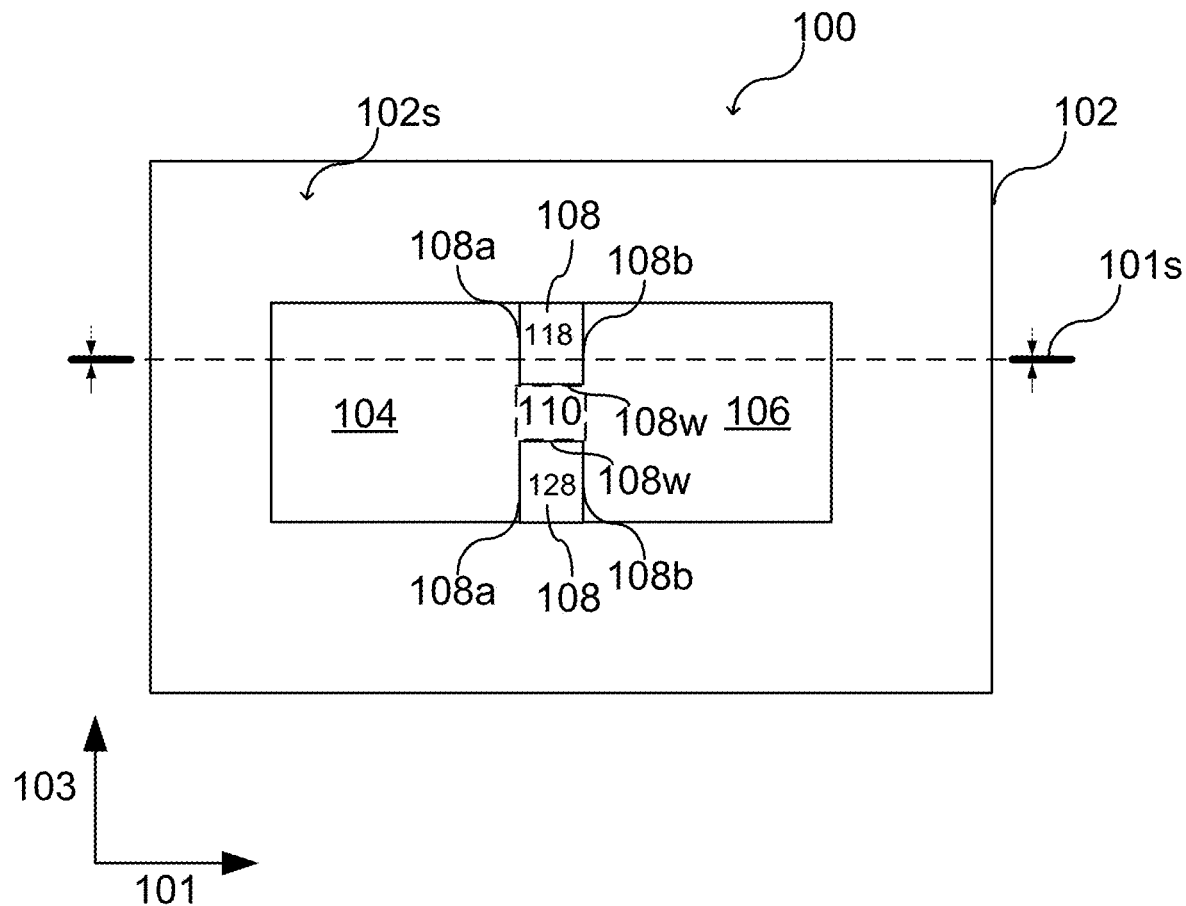

FIG. 1B illustrates an electrostatic discharge (ESD) protection structure 100 in a schematic top view, according to various embodiments. As an example, the cross-sectional view illustrated in FIG. 1A may be a view along cross-section 101s illustrated in FIG. 1B. However, there may be different configurations embodying the same cross-sectional view as illustrated in FIG. 1A.

As illustrated in FIG. 1B, the isolation structure 108 may be segmented to provide at least one trigger region 110 between the first well region 104 and the second well region 106. In other words, the isolation structure 108 may include at least two isolation structure elements 118, 128 (or, in other words, at least two isolation structure portions 118, 128) defining the at least one trigger region 110 between the first well region 104 and the second well region 106 and between the at least two isolation structure elements 118, 128.

According to various embodiments, the isolation structure 108 may have at least two further sidewalls 108w. The at least one trigger region 110 may be disposed between the first well region 104 and the second well region 106 and between the at least two further sidewalls 108w of the isolation structure 108. The further sidewalls 108w of the isolation structure 108 may be spaced apart from each other, e.g. provided by the at least two isolation structure elements 118, 128 that are space apart from each other as well.

The at least one trigger region 110 may include or may consist of semiconductor material. The at least one trigger region 110 may be a portion of the semiconductor layer 102. According to various embodiments, the first well region 104 and the second well region 106 may adjoin each other in the at least one trigger region 110 to form at least one pn-junction. The at least one trigger region may extend from the surface 102s of the semiconductor layer 102 into the semiconductor layer 102. According to various embodiments, the at least one trigger region 110 may connect the first well region 104 and the second well region 106 with each other via at least one pn-junction provided in the respective trigger region 110. Therefore, the first well region 104 and the second well region 106 may also be laterally spaced apart from each other.

Figure 1C:
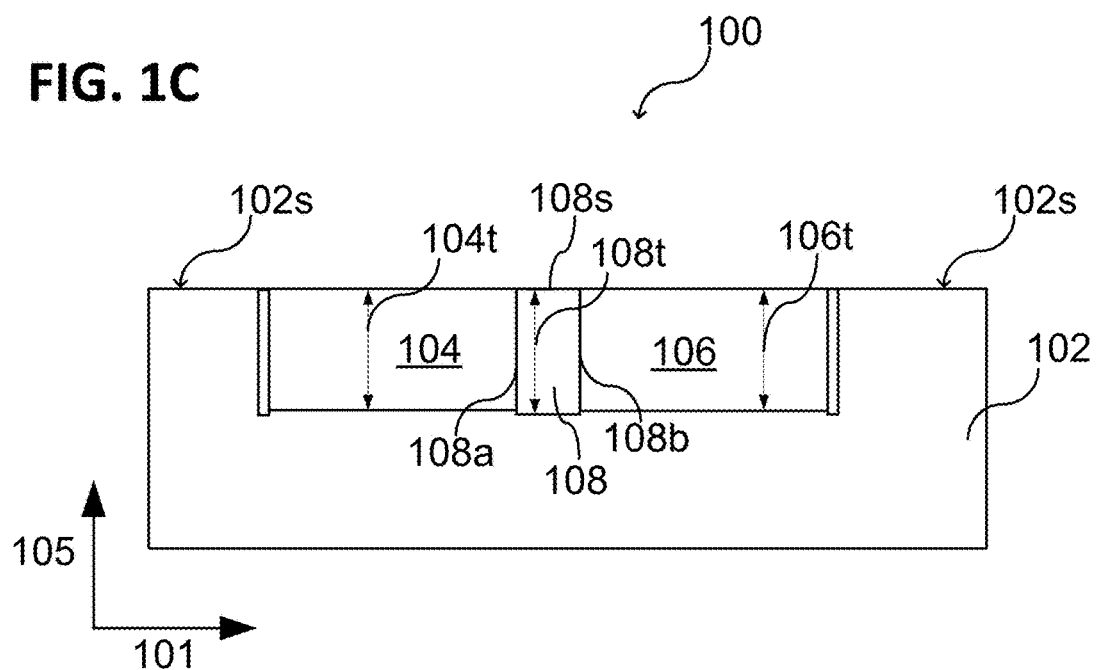
FIGS. 1C and 1D schematically show an electrostatic discharge protection structure in a cross-sectional view and in a top view, according to various embodiments.
Figure 1D:
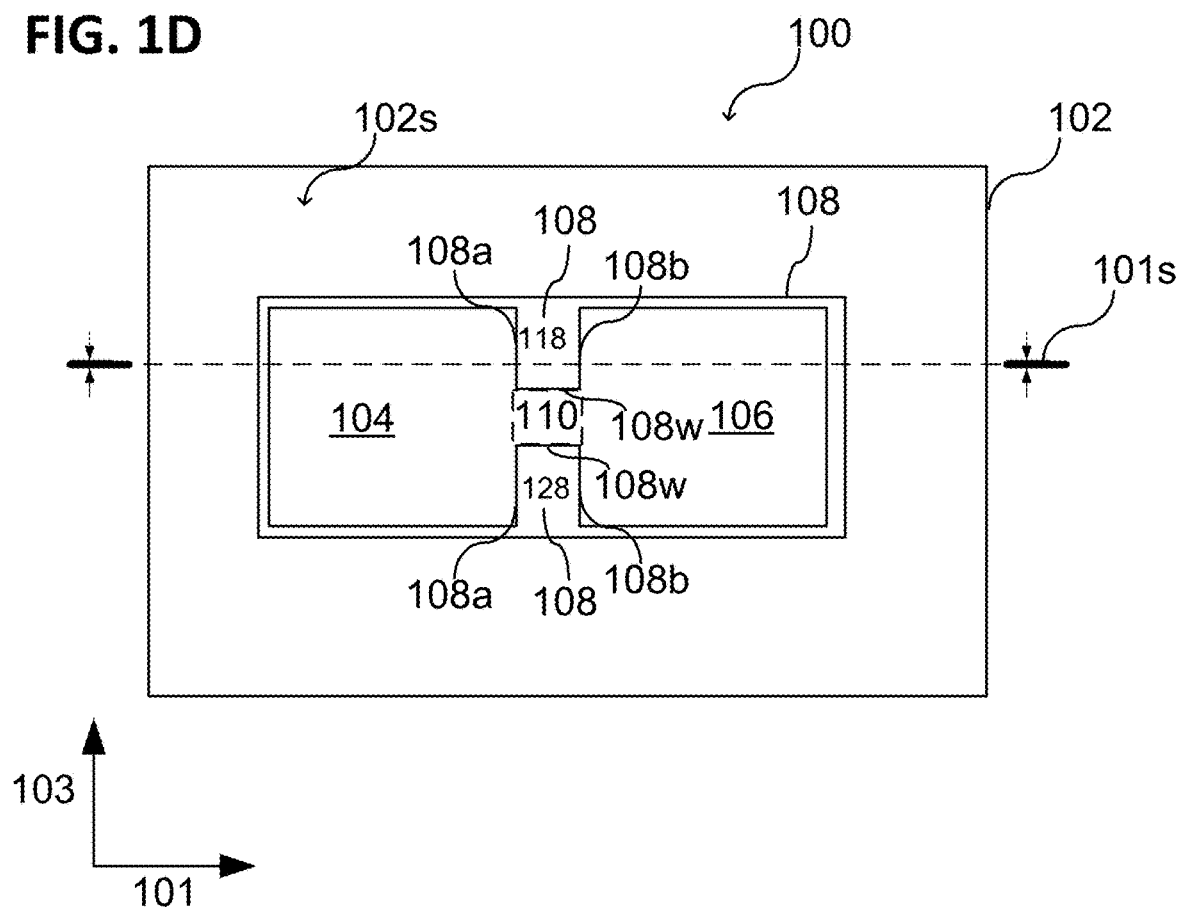

FIG. 1C and FIG. 1D illustrate the ESD protection structure 100 in analogy to the embodiments shown in FIGS. 1A and 1B, wherein the isolation structure 108 further laterally surrounds the first well region 104 and the second well region 106, according to various embodiments.

According to various embodiments, the isolation structure 108 may only be segmented in the region between the first well region 104 and the second well region 106 and completely surround the first well region 104 and the second well region 106. The one or more portions of the isolation structure 108 disposed between the first well region 104 and the second well region 106 may have the same width as the other portions of the isolation structure 108 laterally surrounding the first well region 104 and the second well region 106. Alternatively, the one or more portions of the isolation structure 108 disposed between the first well region 104 and the second well region 106 may have a greater width than the other portions of the isolation structure 108 laterally surrounding the first well region 104 and the second well region 106. Alternatively, the one or more portions of the isolation structure 108 disposed between the first well region 104 and the second well region 106 may have a smaller width than the other portions of the isolation structure 108 laterally surrounding the first well region 104 and/or the second well region 106.

According to various embodiments, the portion of the isolation structure 108 laterally surrounding the first well region 104 may have a similar depth as the first well region 104. According to various embodiments, the portion of the isolation structure 108 laterally surrounding the second well region 106 may have a similar depth as the first well region 104 or the second well region 106.

According to various embodiments, the depth 104t of the first well region 104 may be greater than the depth 106t of the second well region 106. In this case, the portion of the isolation structure 108 laterally surrounding the first well region 104 may have a greater depth than the portion of the isolation structure 108 laterally surrounding the second well region 106. However, also in this case all portions of the isolation structure 108 may have the same depth similar to the depth of the first well region 104.

Figure 1E:
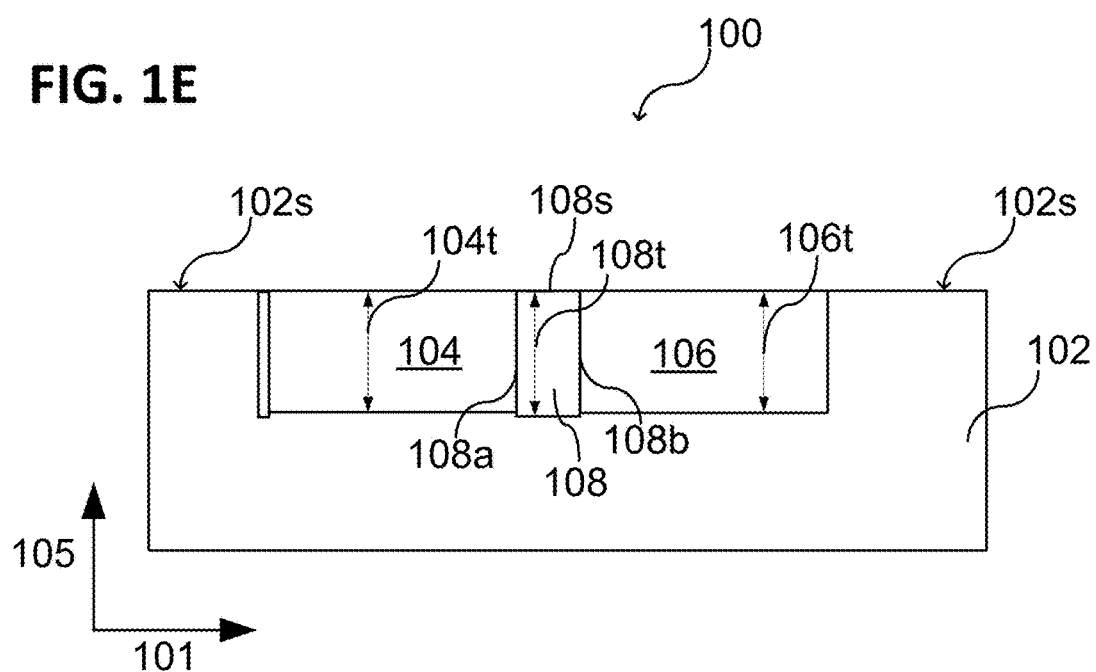
FIGS. 1E and 1F schematically show an electrostatic discharge protection structure in a cross-sectional view and in a top view, according to various embodiments.
Figure 1F:
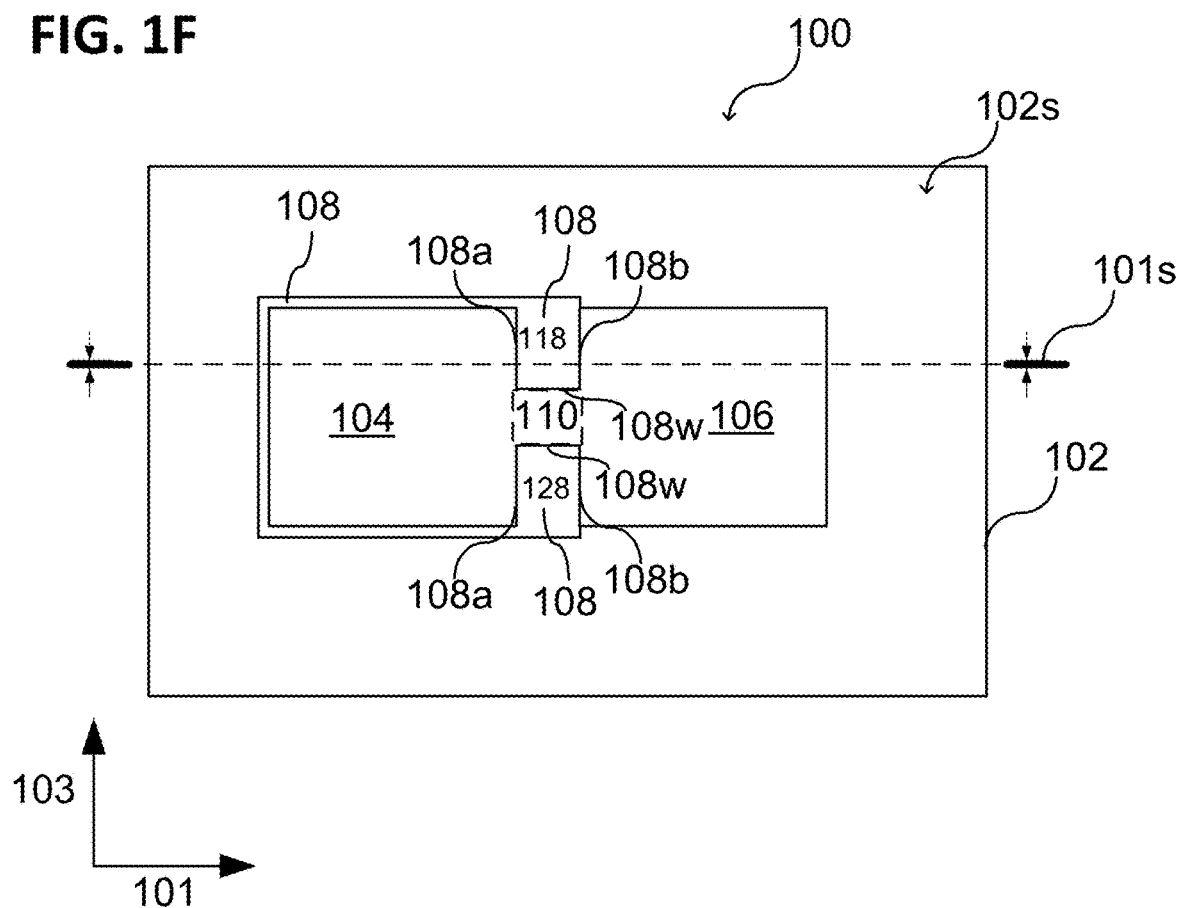

FIG. 1E and FIG. 1F illustrate the ESD protection structure 100 in analogy to the embodiments shown in FIGS. 1A and 1B, wherein the isolation structure 108 further laterally surrounds the first well region 104, according to various embodiments. In this case, the second well region 106 may not be laterally surrounded by the isolation structure 108. However, a sidewall 108b of the isolation structure 108, e.g. respectively a sidewall 108b of the isolation structure elements 118, 128, may be in contact or may face the second well region 106.

Various modifications and/or configurations of the ESD protection structure 100 and details referring to the isolation structure 108 and the at least one trigger region 110 are described in the following, wherein the features and/or functionalities described referring to FIGS. 1A to 1F may be included analogously. Further, the features and/or functionalities described in the following may be included in the ESD protection structure 100 or may be combined with the ESD protection structure 100, as described above referring to FIGS. 1A to 1F.

Figure 2A:
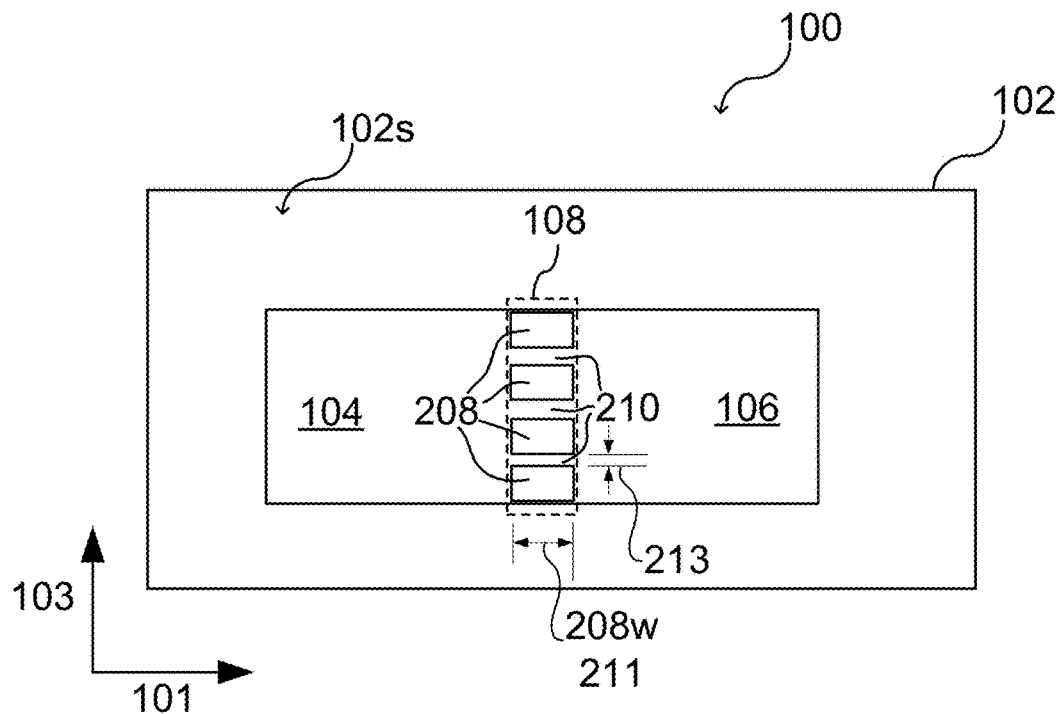
FIGS. 2A to 2C show an electrostatic discharge protection structure in a schematic top view respectively, according to various embodiments.

FIG. 2A illustrates the ESD protection structure 100 in a schematic top view, according to various embodiments. The ESD protection structure 100 may include an isolation structure 108 disposed between the well regions 104, 106 and segmented into a plurality of isolation structure elements 208. The isolation structure 108 provides a plurality of trigger regions 210 between the respective isolation structure elements 208 accordingly. The length 211 (e.g. the extension along direction 101) of the trigger regions 210 may be defined by the width 208w (e.g. the extension along direction 101) of the isolation structure elements 208 disposed between the first well region 104 and the second well region 106. The width 213 (e.g. the extension along direction 103) of the trigger regions 210 may be defined respectively by the gaps provided between the adjacent isolation structure elements 208.

Figure 2B:
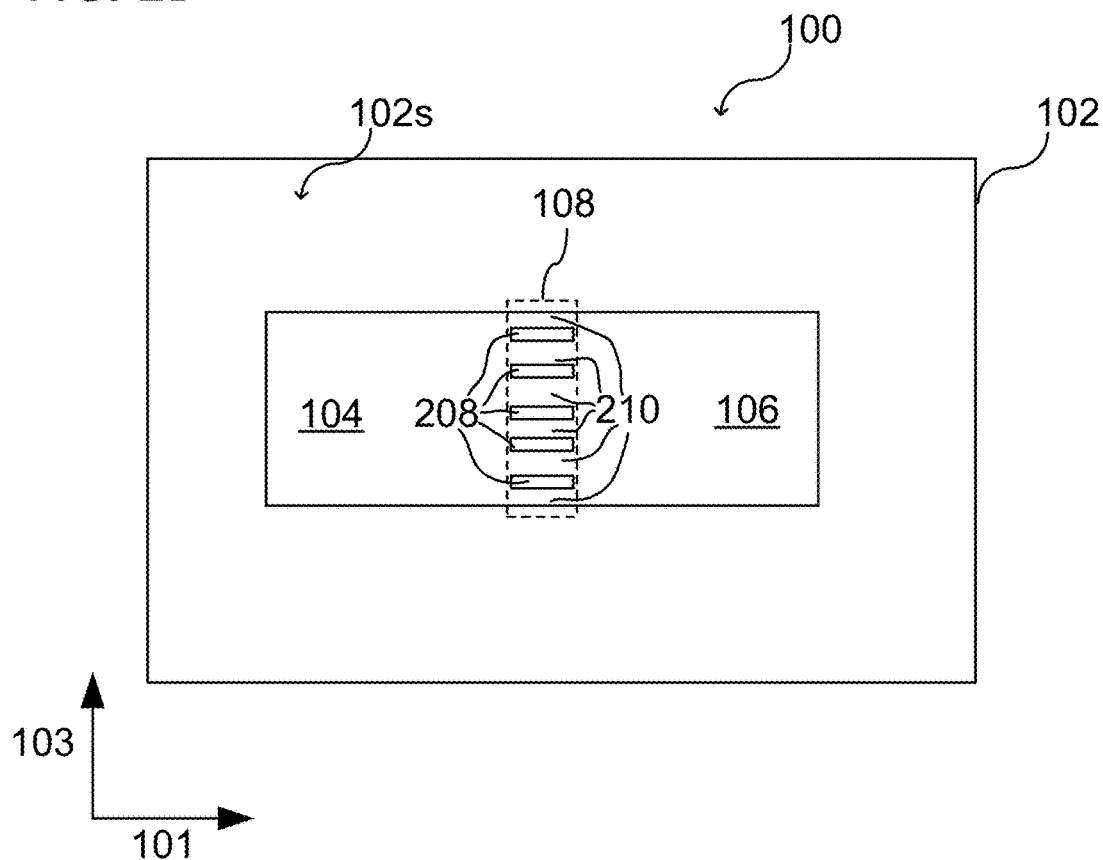

By adjusting the width 213 and the amount of the trigger regions 210 (i.e. the gaps in the isolation structure 108) the contribution of the trigger regions 210 to the total device capacitance and the series resistance associated with the trigger breakdown can be adjusted, according to various embodiments. More and/or wider trigger regions 210, as for example illustrated schematically in FIG. 2B in a top view of the ESD protection structure 100, may increase the capacitance and reduce the series resistance between the wells 104, 106.

According to various embodiments, each of the one or more trigger regions 210 may include at least one pn-junction coupling the first well region 104 and the second well region 106 with each other. A pn-junction may be provided respectively by the first well region 104 and the second well region 106 adjoining each other in each of the trigger regions 210. However, the one or more trigger regions 210 may be doped as desired to include more than one pn-junction (e.g. along the direction 101 between the well regions 104, 106) or to provide at least one pn-junction in the respective trigger region 210 if the first well region 104 and the second well region 106 are laterally spaced apart from each other.

Figure 2C:
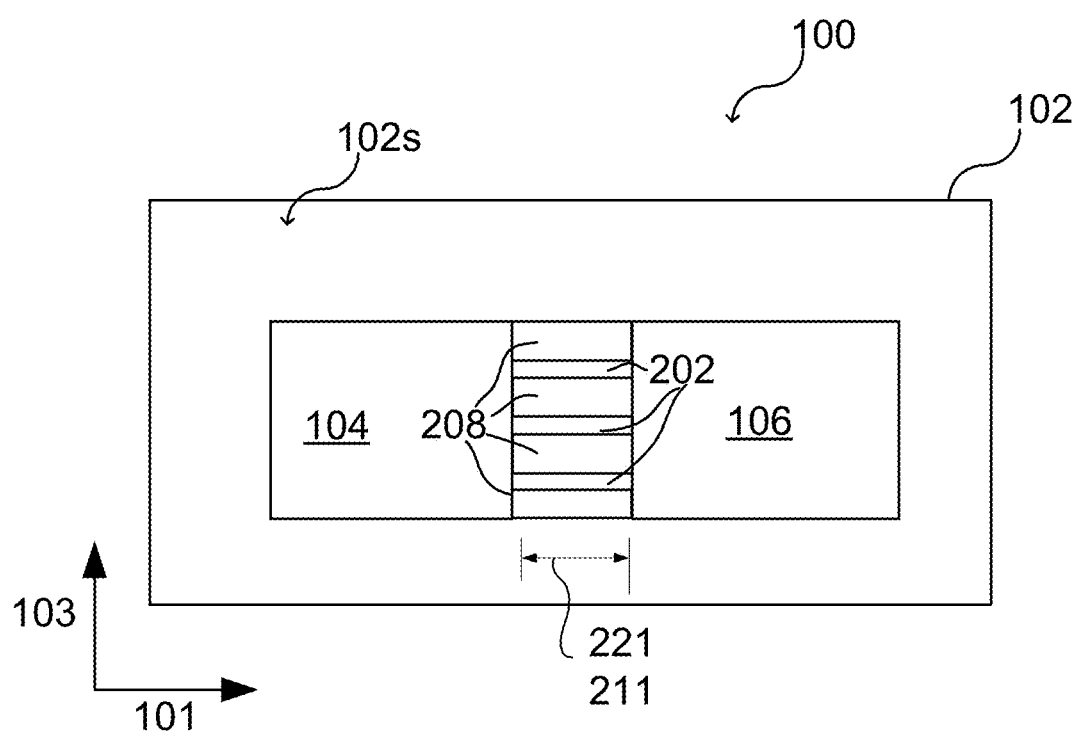

According to various embodiments, the first well region 104 and the second well region 106 may be laterally spaced apart from each other with a distance 211 (e.g. along direction 101), as for example illustrated schematically in FIG. 2C in a top view of the ESD protection structure boo. In this case, the one or more trigger regions 210 may include intrinsic semiconductor material 202 of the semiconductor layer 102 that may be doped additionally to provide at least one pn-junction in the respective trigger region 210 coupling the first well region 104 and the second well region 106 to each other. The distance 211 may define the length of the respective trigger regions 210.

The ESD protection structure 100 as described above may be configured as a lateral thyristor structure including additional doped regions to provide this functionality.

Figure 3A:
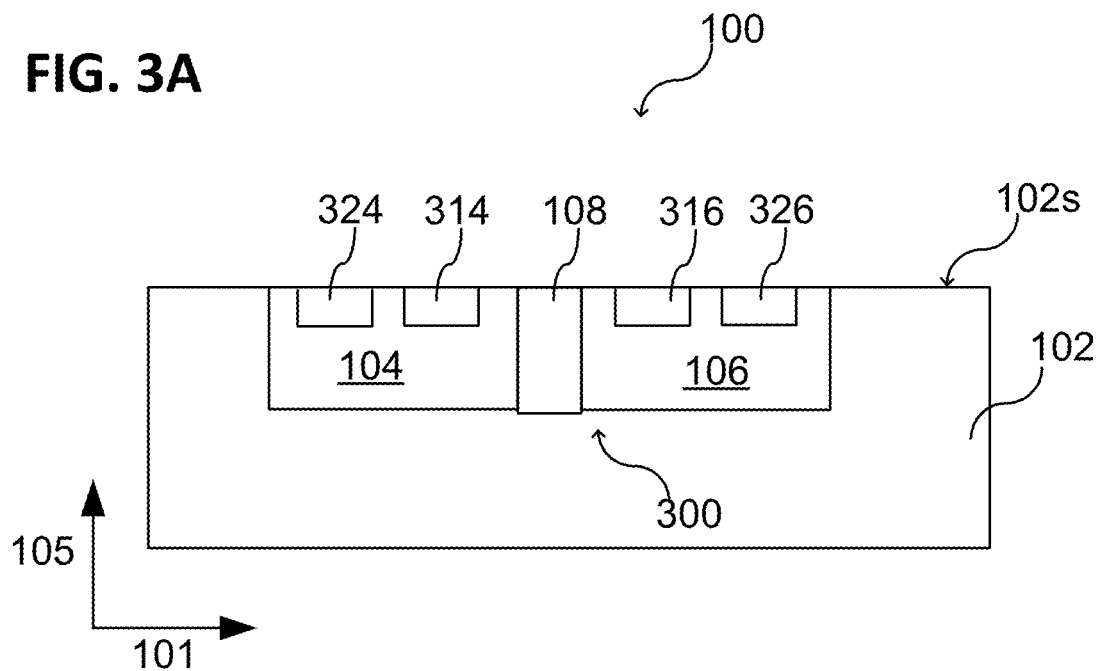
FIGS. 3A to 3G schematically show an electrostatic discharge protection structure in a cross-sectional view respectively, according to various embodiments.

FIG. 3A illustrates an ESD protection structure boo in a schematic cross-sectional view that is configured for example as a lateral thyristor structure 300. The ESD protection structure 100 may further include a first doped region 314 disposed within the first well region 104 and doped with a dopant of the first doping type. The first doped region 314 and the first well region 104 form a first pn-junction of a lateral thyristor structure 300. Further, as described above, a second pn-junction of the lateral thyristor structure may be provided in the one or more trigger regions 110, 210 (e.g. the first well region 104 and the second well region 106 and/or the one or more trigger regions 110, 210 may provide the second pn-junction of the lateral thyristor structure). Additionally, a further pn-junction of the lateral thyristor structure 300 may be provided by the first well region 104 and the semiconductor (e.g. silicon) layer 102. In other words, the junction of the first well region (e.g. an n-well) 104 to the semiconductor layer 102 (e.g. to the substrate, e.g. the silicon layer) will also form a pn-junction, which will form an SCR path below the isolation structure 108. It will be the main current path during ESD operation (i.e. in a high current regime). The ESD protection structure 100 may further include a second doped region 316 disposed within the second well 106 region and doped with a dopant of the second doping type. The second doped region 316 and the second well region 106 form a third pn-junction of the lateral thyristor structure.

Illustratively, the first doped region 314, the first well region 104, the second well region 106, and the second doped region 316 form a pnpn-structure or an npnp-structure. Accordingly, the first doped region, the second doped region, the first well region, and the second well region are arranged relative to each other as a lateral thyristor structure.

According to various embodiments, a dopant concentration of the first doped region 314 may be greater than a dopant concentration of the first well region 104 (with reference to the respective doping type) and a dopant concentration of the second doped region 316 may be greater than a dopant concentration of the second well region 106 (with reference to the respective doping type). According to various embodiments, the respective dopant concentration of the first doped region 314 and second doped region 316 may be high enough (at least at the surface 102s of the semiconductor layer 102) to provide an ohmic contact with a metallization structure, cf. FIG. 3B and FIG. 7A.

Further, as illustrated in FIG. 3A, the ESD protection structure 100 may include a first contact region 324 disposed in the first well region 104. The first contact region 324 may be doped with a dopant of the second doping type. Further, the ESD protection structure 100 may include a second contact region 326 disposed in the second well region 106. The second contact region may be doped with a dopant of the first doping type. According to various embodiments, a dopant concentration of the first contact region 324 may be greater than a dopant concentration of the first well region 104 and a dopant concentration of the second contact region 326 may be greater than a dopant concentration of the second well region 106. According to various embodiments, the respective dopant concentration of the first contact region 324 and second contact region 326 may be high enough (at least at the surface 102s of the semiconductor layer 102) to provide an ohmic contact with a metallization structure, cf. FIG. 3B and FIG. 7A. According to various embodiments, a dopant concentration of the semiconductor layer 102 may be less than a dopant concentration of the first well region 104 and second well region 106 (with reference to the respective doping type).

Figure 3B:
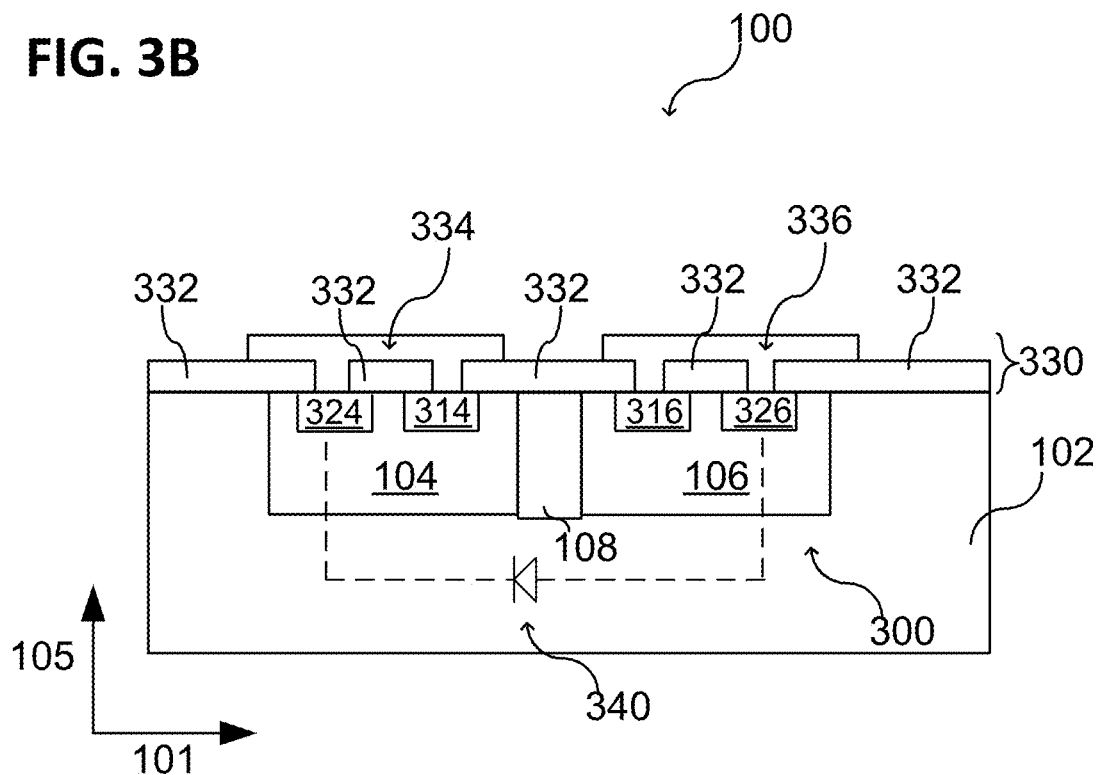

FIG. 3B illustrates an ESD protection structure 100 configured as a lateral thyristor structure 300 in a schematic cross-sectional view. The ESD protection structure 100 may include a metallization 330 for electrically contacting the first doped region 314, the first contact region 324, the second doped region 316, and the second contact region 326. The metallization 330 may include a dielectric layer 332 defining respective contact areas. The metallization 330 may include a first electrically conductive contact structure 334 (also referred to as first metallization structure) contacting the first doped region 314 and/or the first contact region 324. The metallization 330 may further include a second electrically conductive contact structure 336 (also referred to as second metallization structure) contacting the second doped region 316 and/or the second contact region 326. The electrically conductive contact structures 334, 336 may include or be made of any suitable metal or electrically conductive material, as for example degenerated (very highly doped) semiconductor material.

According to various embodiments, the electrically conductive contact structures 334, 336 may provide two terminals to include the ESD protection structure 100 into an ESD protection circuit or into an electronic device as desired to protect at least one electronic circuit from over-voltage/electro-static-discharge damage. According to various embodiments, the first electrically conductive contact structure 334 may be coupled to an I/O pad or supply bus and the second electrically conductive contact structure 336 may be coupled to a ground bus (cf. FIGS. 8A and 8B).

Figure 3C:
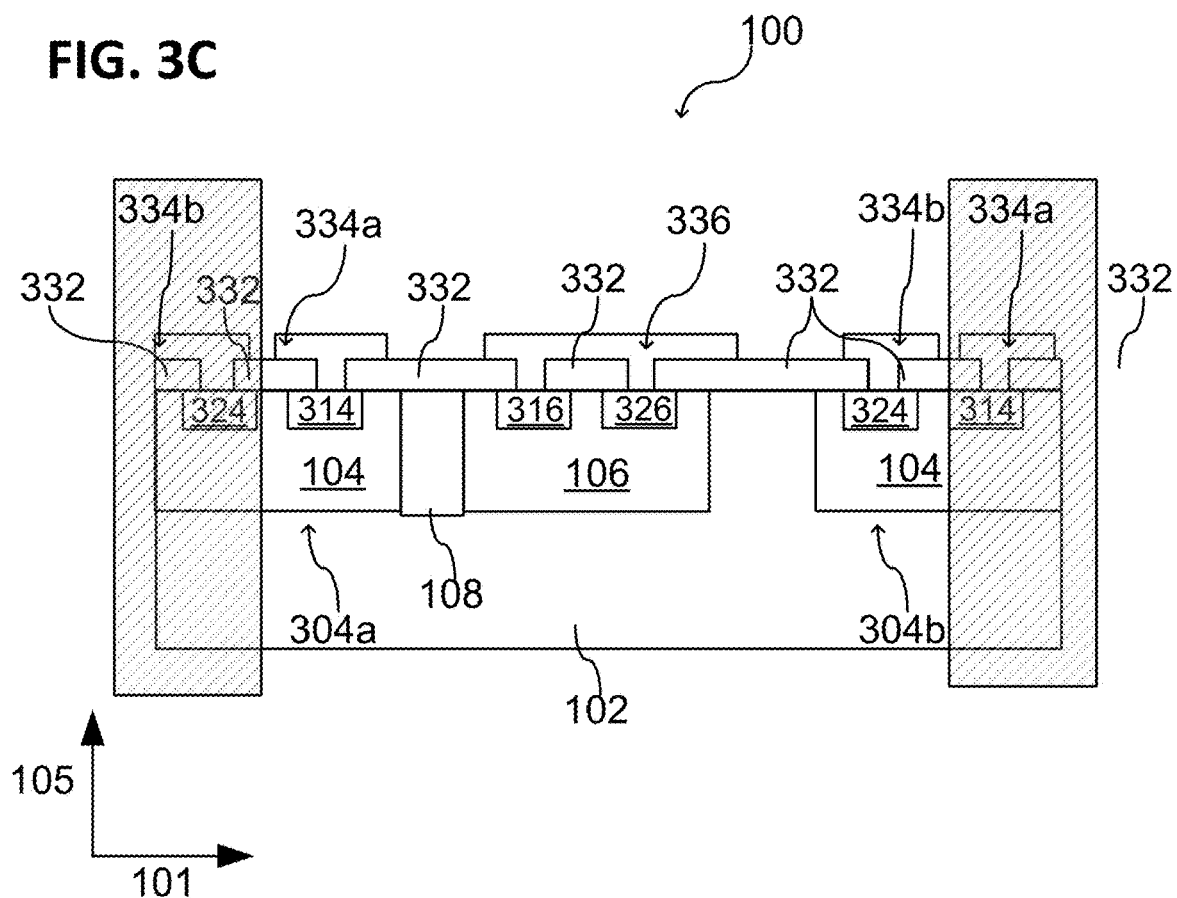

The ESD protection structure 100 may be used as unidirectional ESD protection structure 100 as illustrated in FIG. 3B. A diode symbol 340 illustrates a diode current path from the second contact region 326 (e.g. a p+ region) to the first contact region 324 (e.g. an n+ region) for a negative ESD current/voltage. Alternatively, the ESD protection structure 100 may be used to provide a bi-directional ESD protection structure 100, as illustrated in FIG. 3C and FIG. 3D in schematic cross-sectional views, according to various embodiments.

Illustratively, the first well region 104 may be used in split portions 304a, 304b spaced apart from each other. Accordingly, the first electrically conductive contact structure 334 is split into two portions 334a, 334b electrically conductively connected with each other. The first portion 304a may include the first doped region 314 and the second portion 304b may include the first contact region 324. As illustrated for example in FIG. 3C, the second well region 106 may be arranged between the first portion 304a and the second portion 304b of the first well region 104. Illustratively, the bi-directional ESD protection structure 100 may be provided by forming a plurality of the ESD protection structures 100 next to each other and using corresponding portions of the respective first well regions 104, as illustrated in FIG. 3C.

Figure 3D:
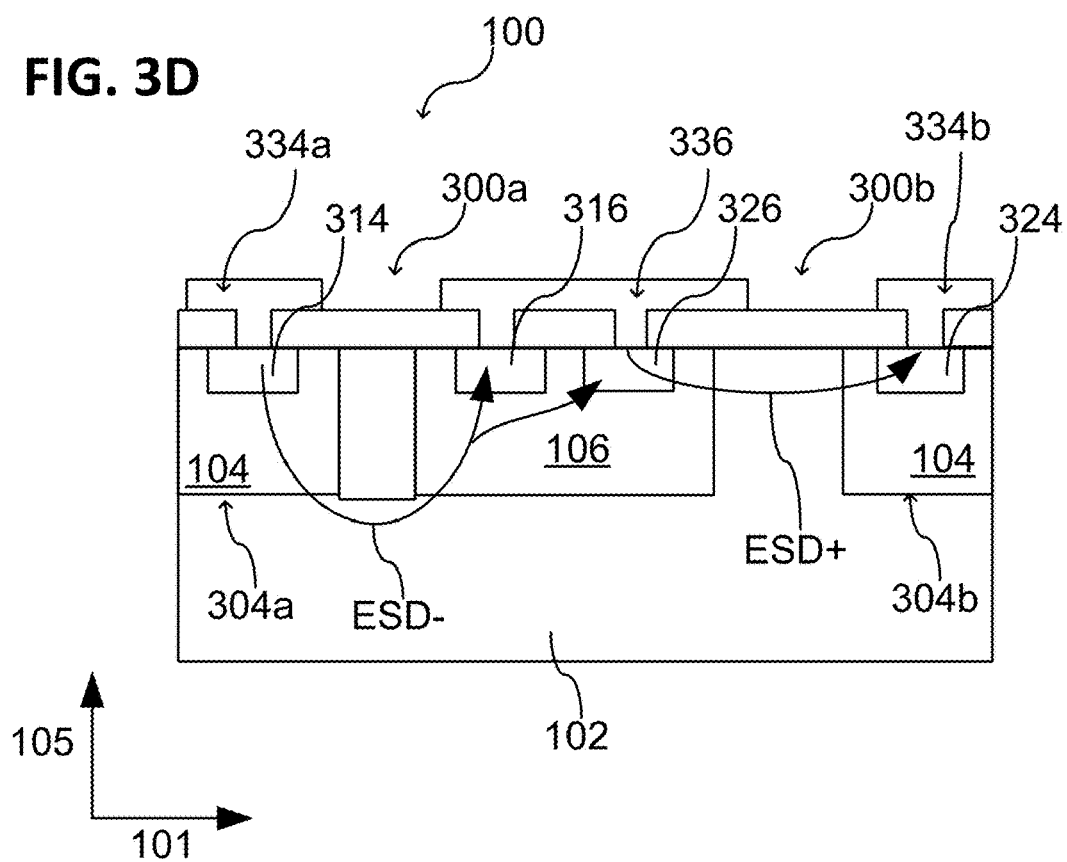

As illustrated in FIG. 3D, the bi-directional ESD protection structure 100 may include a lateral thyristor structure 300a including the first portion 304a of the first well region 104, the first doped region 314, the second well region 106, and the second doped region 316 (i.e. the pnpn- or npnp-structure as described herein) and a PIN-diode structure 300b including the second contact region 326, second well region 106, the second portion 304b of the first well region 104, the first contact region 324, and the intrinsic semiconductor material of the semiconductor layer 102 disposed laterally between the second well region 106 and the second portion 304b of the first well region 104.

According to various embodiments, in the case that the first doping type is p-type and the second doping type is n-type, a negative ESD stress at the first electrically conductive contact structure 334a, 334b (in the same way a positive ESD stress on the second electrically conductive contact structure 336) may be diverted (see ESD– in FIG. 3D) by the lateral thyristor structure 300a. Further, a negative ESD stress at the second electrically conductive contact structure 336 (in the same way a positive ESD stress on the first electrically conductive contact structure 334a, 334b) may be diverted (see ESD+ in FIG. 3D) by the PIN-diode structure 300b. However, other configurations may be used to provide a bi-directional ESD protection structure 100 based on the lateral thyristor structure 300a described herein.

Figure 3E:
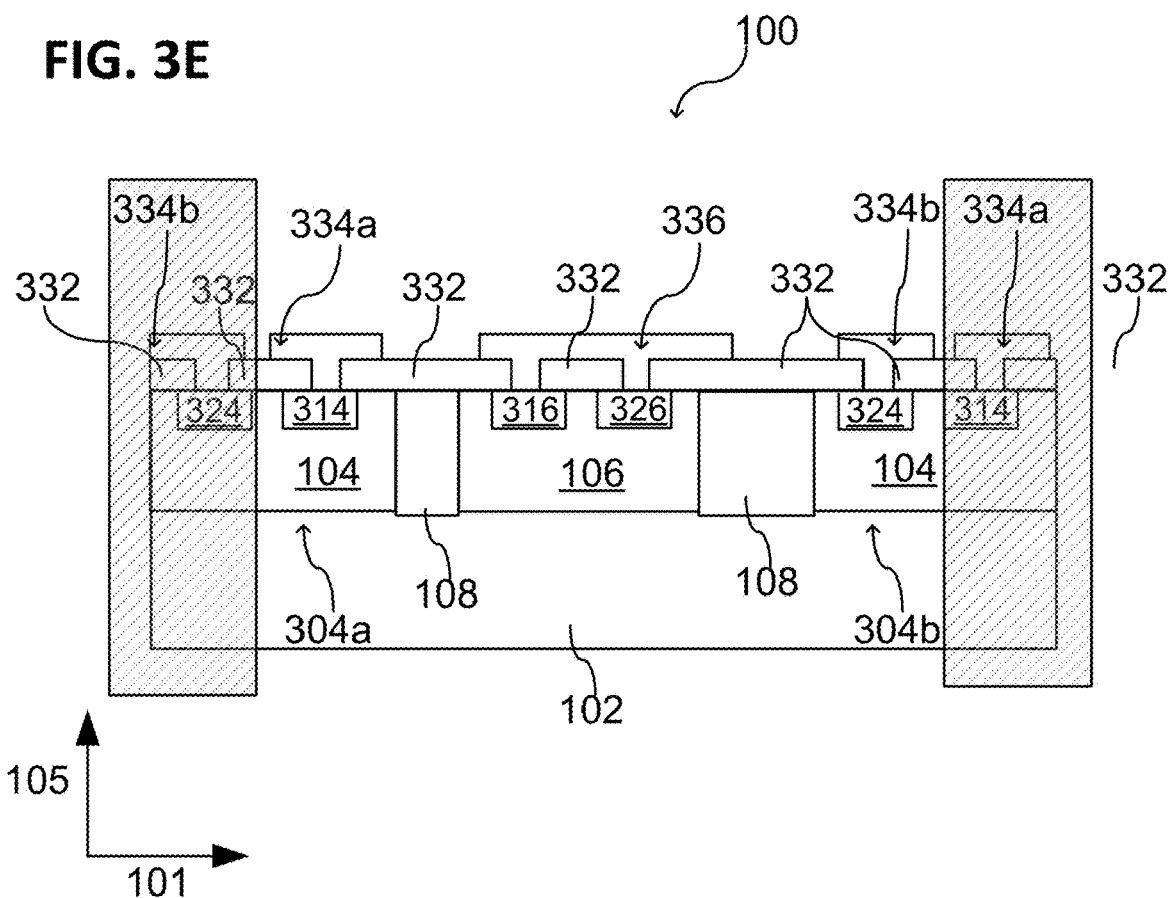
Figure 3F:
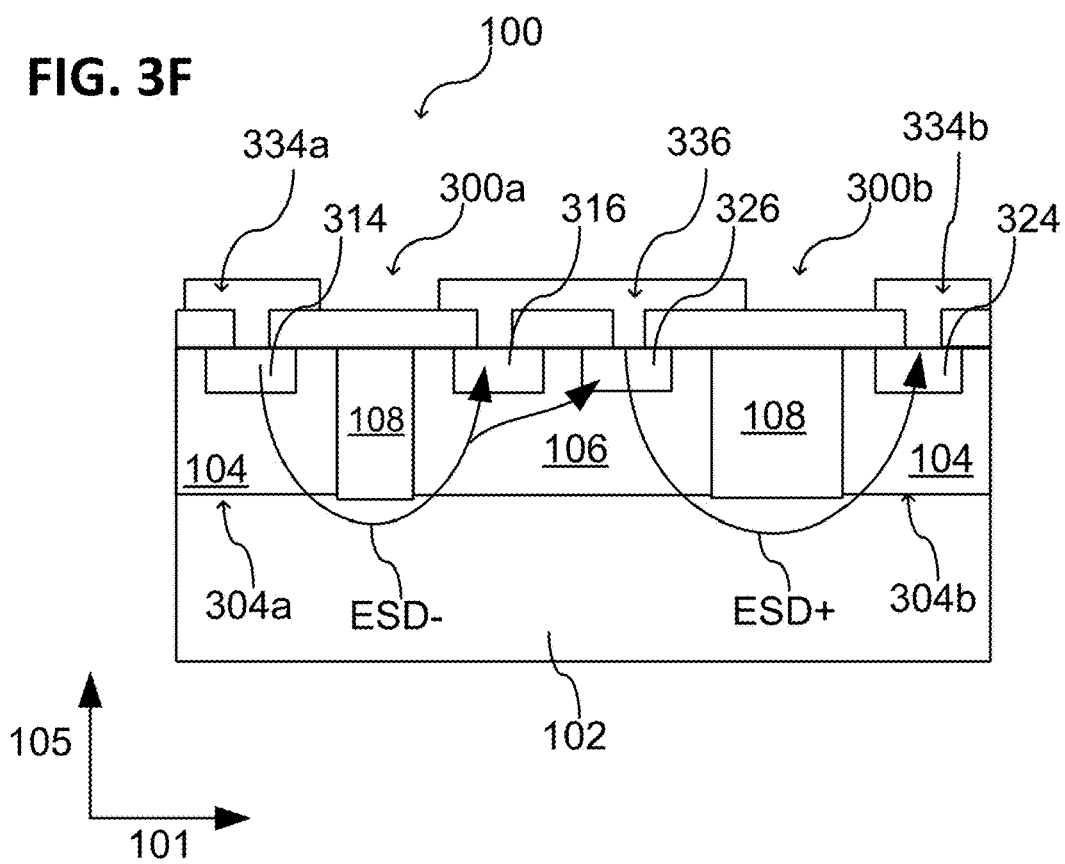

The ESD protection structure 100, as illustrated in FIG. 3E and FIG. 3F in schematic cross-sectional views, may be configured in a similar way as described above with reference to FIGS. 3C and 3D, but with the isolation structure 108 also arranged between the well regions 104, 106 in the diode current path (ESD+). This will further reduce the capacitance of this structure ESD protection structure 100.

Figure 3G:
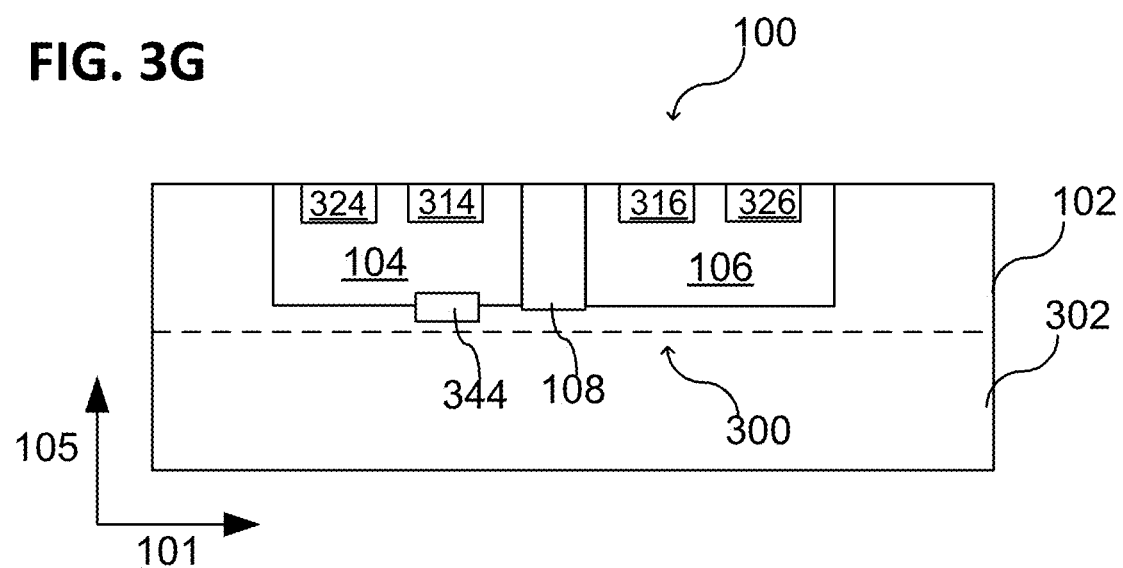

FIG. 3G illustrates an ESD protection structure 100 in a schematic cross-sectional view, according to various embodiments. The ESD protection structure 100 may be configured as lateral thyristor structure 300 and further include a semiconductor substrate layer 302 disposed below the semiconductor layer 102. The semiconductor substrate layer 302 is doped with a dopant of the first doping type. Further, a dopant concentration of the semiconductor substrate layer 302 may be greater than a dopant concentration of the semiconductor layer 102. According to various embodiments, a vertical breakdown region 344 may be disposed between the first well region 104 and the semiconductor substrate layer 302. The vertical breakdown region 344 is doped with a dopant of the second doping type. The vertical breakdown region 344 may assist a vertical breakdown with a current flow through the semiconductor substrate layer 302 that has a higher doping concentration than the semiconductor layer 102 and therefore also a higher electrical conductivity. The semiconductor substrate layer 302 may be a semiconductor wafer or a part of a semiconductor wafer. According to various embodiments, the semiconductor layer 102 disposed over (e.g. directly on) the semiconductor substrate layer 302 may be formed as an epitaxial semiconductor layer grown on the semiconductor substrate layer 302.

According to various embodiments, at least one capacitance determining well region 104 (i.e. the well region with the opposite doping type with reference to the semiconductor layer 102) in a lateral SCR may be enclosed with a shallow trench isolation 108 (or any other suitable isolation structure 108) to achieve an ultra-low capacitance device 100. By leaving out gaps in the shallow trench isolation enclosure local regions with reduced breakdown voltage (also referred to as trigger regions 110, 210) can be easily realized to adjust the SCR trigger voltage to low values, e.g. less than about 10 V if desired. Minimal costs/effort in the manufacturing process can be achieved. According to various embodiments, a substitution of semiconductor area that generates a big portion of device capacitance with a material that decreases the capacitance per perimeter length may be provided. The substitution may simultaneously act as a self-aligned structuring for the trigger structure to use as less manufacturing processes as possible.

The ESD protection structure 100 described herein, according to various embodiments, may enable a reduction of device capacitance without shrinking the active area of the ESD protection device. The ESD protection structure 100 described herein, according to various embodiments, may enable a low voltage triggering by using a locally reduced collector-base breakdown with minimum deterioration on the device capacitance. The ESD protection structure 100 described herein, according to various embodiments, may enable a low capacitance and low ohmic body diode to solve the reverse blocking nature of the pnpn semiconductor (e.g. silicon) structure (cf. FIGS. 3C and 3D).

A low-capacitance, lateral SCR-based transient-voltage-suppression (TVS, also referred to ESD) device 100 is provided herein, according to various embodiments, consisting of or including an n-well and a p-well deposited in high resistivity wafer, which includes an enclosure of the n-well by a non-conductive, low dielectric constant material (e.g. STI) to reduce the edge contribution to the total device capacitance, and by leaving small gaps in the non-conducting, border-enclosing material (e.g. STI) local trigger structures are included in the device.

According to various embodiments, the (e.g. small) gaps in the isolation structure 108 may give only a low additional capacitance contribution. The trigger breakdown voltage may be determined by the n-well/p-well breakdown (in the gap of the non-conductive material) or by dedicated trigger implant in this region. By using an at least partially self-aligned implantation of an ESD trigger implantation an adjustment of the trigger voltage may be possible. According to various embodiments, the capacitance reduction of edge capacitance may be reduced by for example 67% compared to a similar structure without the non-conductive enclosure. The total well capacitance can be reduced by for example 33%. A key parameter may be the capacitance per area, C/A, which can be achieved. According to various embodiments, a combination of a low-doped substrate with dielectric material is used to decrease the C/A below the silicon limit.

According to various embodiments, the isolation structure 108 described herein (e.g. an STI) may have different shapes and may depend on the used technology and the desired performance. First, according to various embodiments, a high ohmic (low-doped) boron substrate 102 may be used to achieve a wide depletion region to achieve a low capacitance device. Two well regions 104, 106 may form the base regions of the lateral thyristor structure 300. The doping may vary in the range from about 1e17 cm-3 to about 1e19 cm-3 for each doping species to adjust the thyristor-parameters.

In one or more embodiments (cf. FIG. 2A), the well regions 104, 106 are close to each other without any substantial spacing to generate a low n-well to p-well breakdown voltage. The isolation structure 108 may be placed in between the n-well to p-well junction region to remove the silicon area. Some (e.g. small) gaps may be included to form a small cross-sectional area for the remaining n-well-to-p-well junction that will act as trigger region for the lateral thyristor structure. Optionally, the isolation structure 108 may be placed around the entire n-well region to decrease the perimeter capacitance as much as possible. The isolation structure 108 may be deeper than the junction depth of the n-well (cf. junction depth 704d in FIG. 7A). Optionally, the isolation structure 108 may be placed around the entire p-well region to decrease the perimeter capacitance as much as possible.

In one or more embodiments, a distance 211 may be provided between the n-well and p-well (cf. FIG. 2C) to lower the intrinsic capacitance of the thyristor base cell. The low-doped boron substrate may be all around the n-well region which may form a wide depletion region around the n-well. The depth position to which the isolation structure 108 (e.g. an STI, i.e. an oxide trench) extends may be lower (e.g. deeper) than the depth position of the well to substrate junction (e.g. the junction 704d formed by the n-type first well region 104 and the p-type semiconductor layer 102, cf. FIG. 7A) and therefore also deeper than the vertical extension of the n-well to p-well junction because otherwise a significant cross-section of the lateral n-well to p-well junction will be formed. The first doping type (e.g. p-type)

contact mask for forming (e.g. implanting) the second contact region 326 may be extended to cover the spacing between the n-well-to-p-well regions (i.e. the one or more trigger regions no, 210). According to various embodiments, the isolation structure 108 may allow an at least partially self-aligned structuring (cf. FIGS. 10 to 13). In other words, the isolation structure 108 may assist the forming of one or more doped regions in the semiconductor layer 102.

Figure 4:
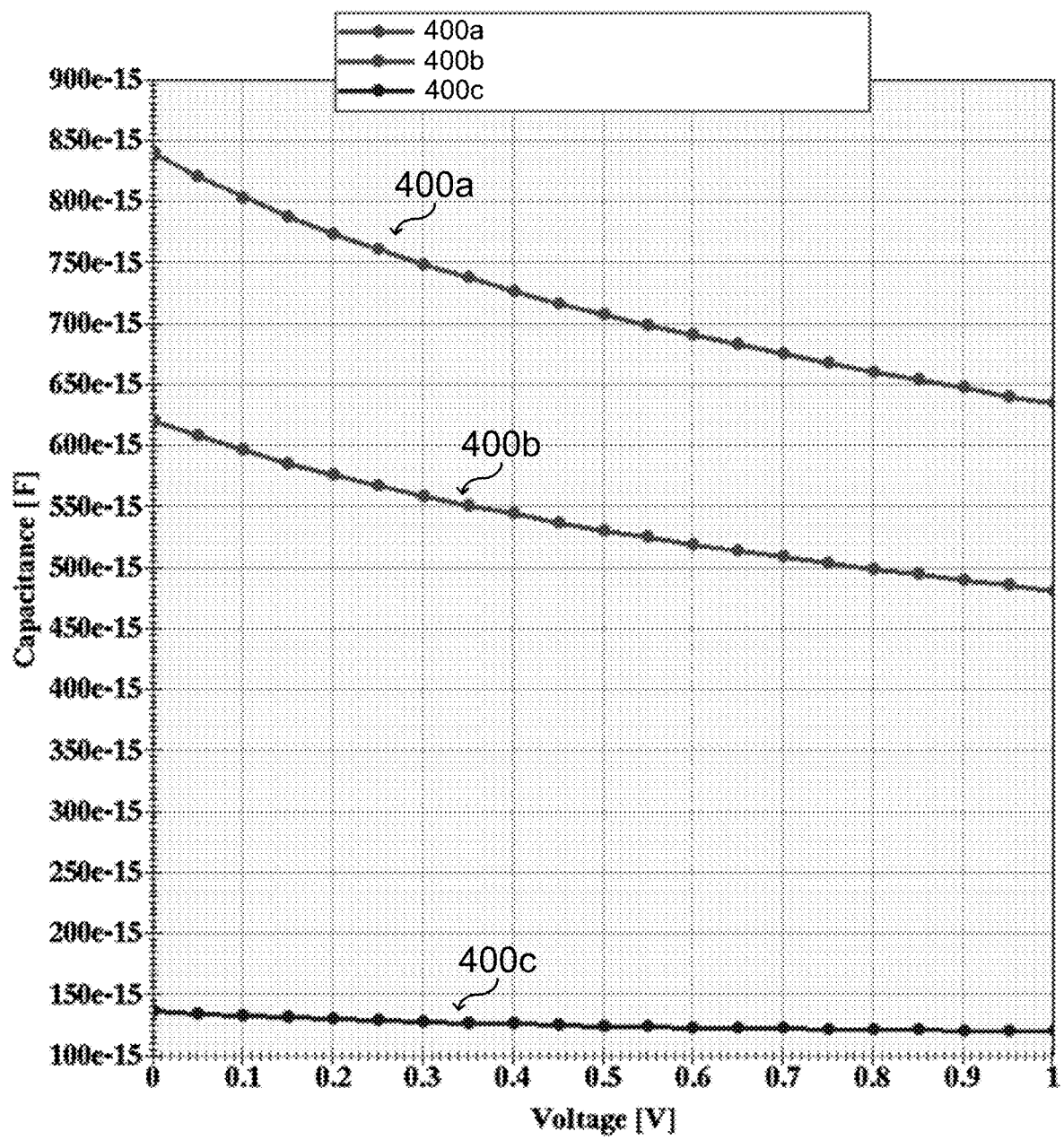
FIGS. 4 to 6 show electrical properties of various electrostatic discharge protection structures respectively, according to various embodiments.

FIG. 4 illustrates a capacitance of various ESD protection structures dependent on an applied voltage. The curve 400*b* illustrates the capacitance of the ESD protection structure including an isolation structure 108 as described for example with reference to FIGS. 1A, 1B, and 3B. In this case, the isolation structure 108 is disposed only between the oppositely doped wells 104, 106 (i.e. the isolation structure 108 may not laterally surround the well regions 104, 160). The curve 400*c* illustrates the capacitance of the ESD protection structure including an isolation structure 108 as described for example with reference to FIGS. 1C and 1D. In this case, the isolation structure 108 is disposed between the oppositely doped well regions 104, 106 and completely surrounds both of the well regions 104, 106. As a reference, curve 400*a* illustrates the capacitance of a similar configured conventionally used ESD protection structure without an isolation structure between the wells and/or surrounding the wells.

As can be seen in FIG. 4, the isolation structure 108 described herein significantly reduces the capacitance of the ESD protection structure 100, e.g. comparing curves 400*a* and 400*c* with each other by more than 80%. The curves 400*b*, 400*c* correspond to isolation structures 108 having respectively substantially the same depth as the first well region 104.

Figure 5:
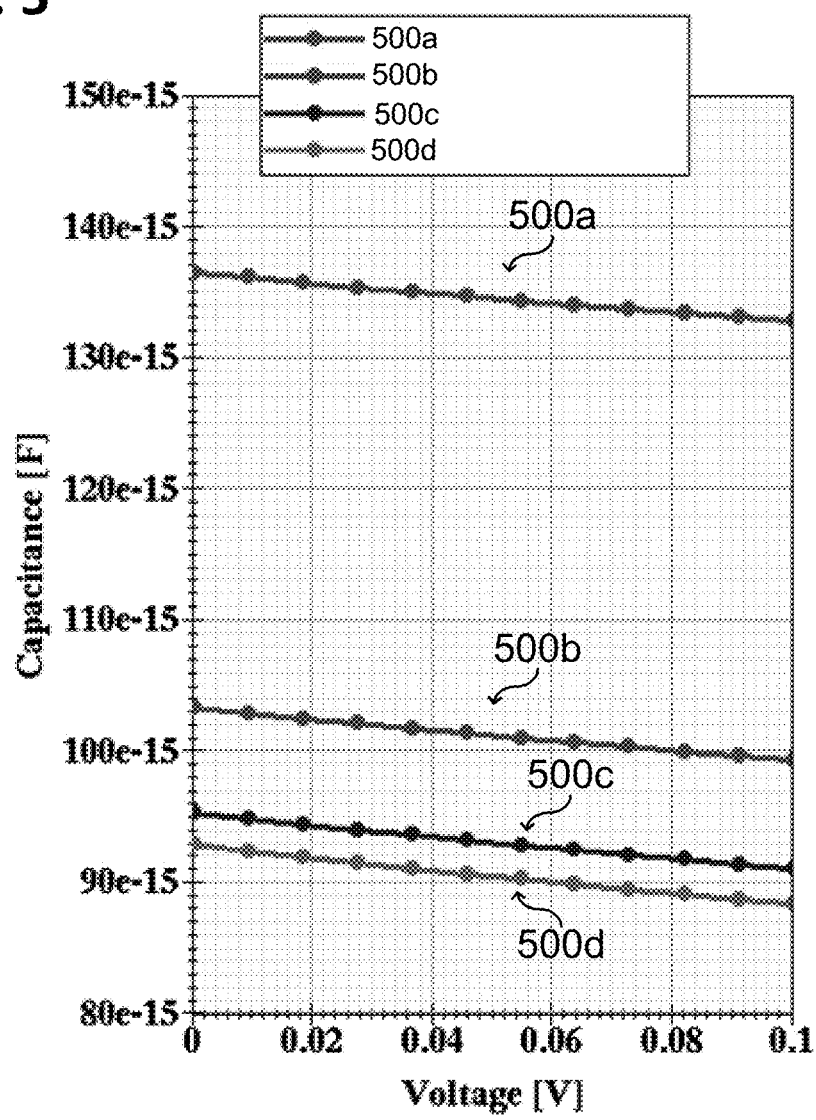

FIG. 5 illustrates a capacitance of various ESD protection structures dependent on an applied voltage. The curves 500*a*, 500*b*, 500*c*, 500*d* illustrate respectively the capacitance of the ESD protection structure including an isolation structure 108 as described for example with reference to FIGS. 1E and 1F. In these cases the isolation structure 108 is disposed between the oppositely doped well regions 104, 106 and completely surrounds the first well region 104 (i.e. the isolation structure 108 not surrounding the second well region 106). The width (e.g. the extension along direction 101) of the isolation structure 108 is increasing for curves 500*a* to 500*d*. The width (e.g. the extension along direction 101) of the first well region 104 (e.g. of the n-well junction) is the same for all curves 500*a* to good, e.g. 3.4 μm.

As can be seen in FIG. 5, an increasing width of the isolation structure 108 between the first well region 104 and the second well region 106 leads to a reduction of the capacitance of the ESD protection structure boo. The width of the isolation structure 108 may be about 0.85 μm (cf. curve 500*a*), about 1.85 μm (cf. curve 500*b*), about 2.85 μm (cf. curve 500*c*), or about 3.85 μm (cf. curve 500*d*). According to various embodiments, the width of the isolation structure 108 may be in the range from about 0.5 μm to about 4 μm, or even greater than about 4 μm. According to various embodiments, the C/A parameter may be about 0.043 fF/μm$^2$ or less, wherein C is the capacitance of the ESD protection structure 100 and A is the area of the first well region 104 (e.g. of the n-well junction).

Figure 6:
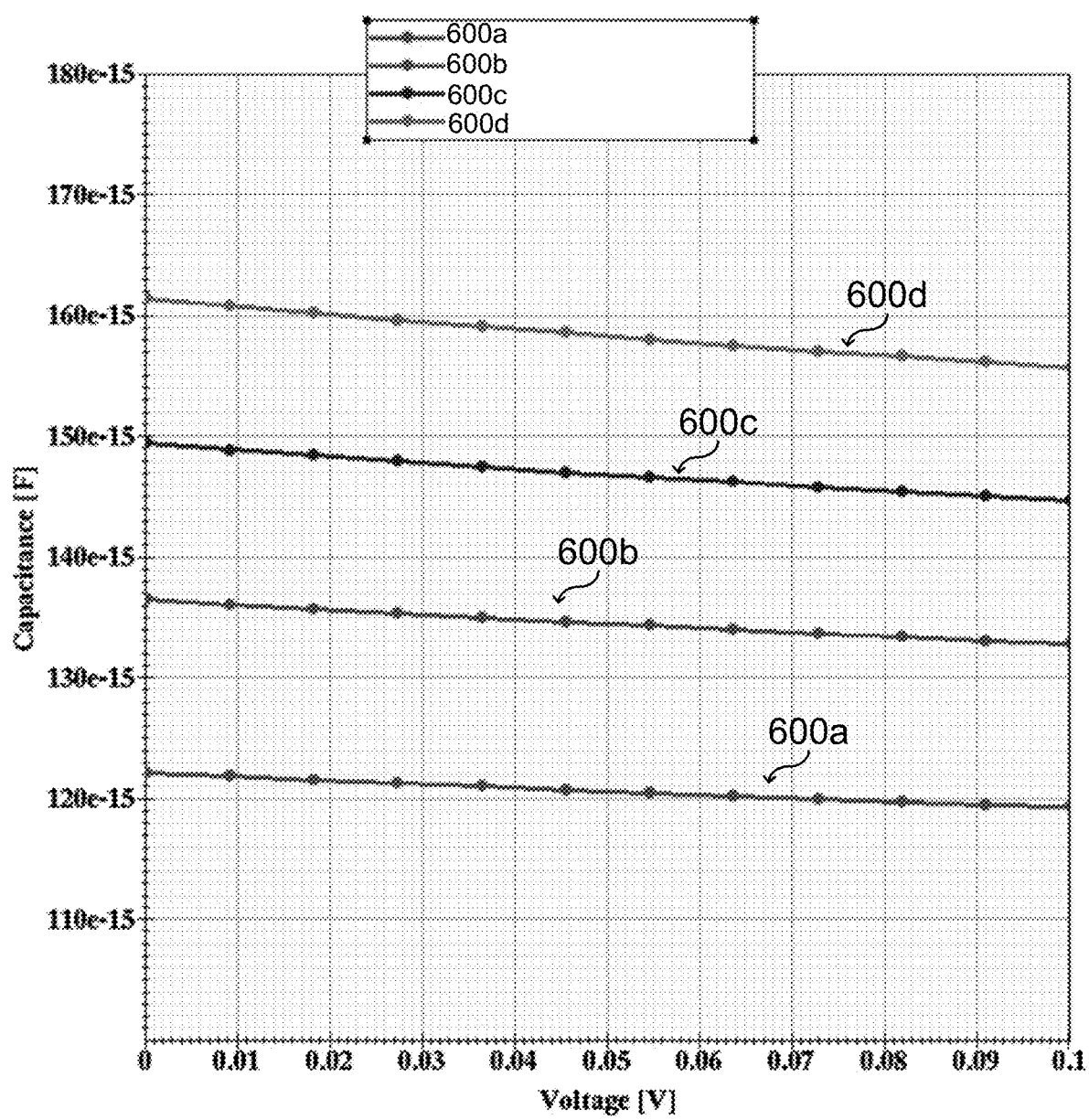

FIG. 6 illustrates a capacitance of various ESD protection structures dependent on an applied voltage. The curves 600*a*, 600*b*, 600*c*, 600*d* illustrate respectively the capacitance of the ESD protection structure including an isolation structure 108 as described for example with reference to FIGS. 1E and 1F. In these cases, the isolation structure 108 is disposed between the oppositely doped well regions 104, 106 and completely surrounds the first well region 104 (i.e. the isolation structure 108 not surrounding the second well region 106). The width (e.g. the extension along direction 101) of the first well region 104 (therefore, the area of the junction between the first well 104 and the semiconductor layer 102, e.g. the n-well junction area) is increasing from curve 600*a* to 600*d*. The width (e.g. the extension along direction 101) of the isolation structure 108 is constant for all of the curves 600*a* to 600*d*.

As can be seen in FIG. 6, a decreasing width of the first well region 104 leads to a reduction of the capacitance of the ESD protection structure 100. The width (e.g. the extension along direction 101) of the first well region 104 may be about 6.4 μm (cf. curve 600*a*), about 5.4 μm (cf. curve 600*b*), about 4.4 μm (cf. curve 600*c*), or about 3.4 μm (cf. curve 600*d*). According to various embodiments, the width of the first well region 104 may be in the range from about 1 μm to about 6 μm, or even less than about 1 μm or greater than about 6 μm. According to various embodiments, the C/A parameter may be about 0.035 fF/μm$^2$ or less, wherein C is the capacitance of the ESD protection structure 100 and A is the area of the first well region 104. The first well region 104 may have a rectangular-shape in top-view so that the area of the first well region 104 can be easily determined by the multiplying the width and the length (e.g. the extension along direction 103) of the first well region 104. The first well region 104 may have a length of about 10 μm to about 100 μm, as example. The extension of the well regions 104, 106 along the direction 103 may be selected as desired, e.g. may be scaled (also referred to as finger structure). However, since the area of the first well region 104 is may be proportional to the width, other values greater than 100 μm or less than 10 μm may be selected for the length of the first well region 104 and second well region 106 if desired.

Figure 7A:
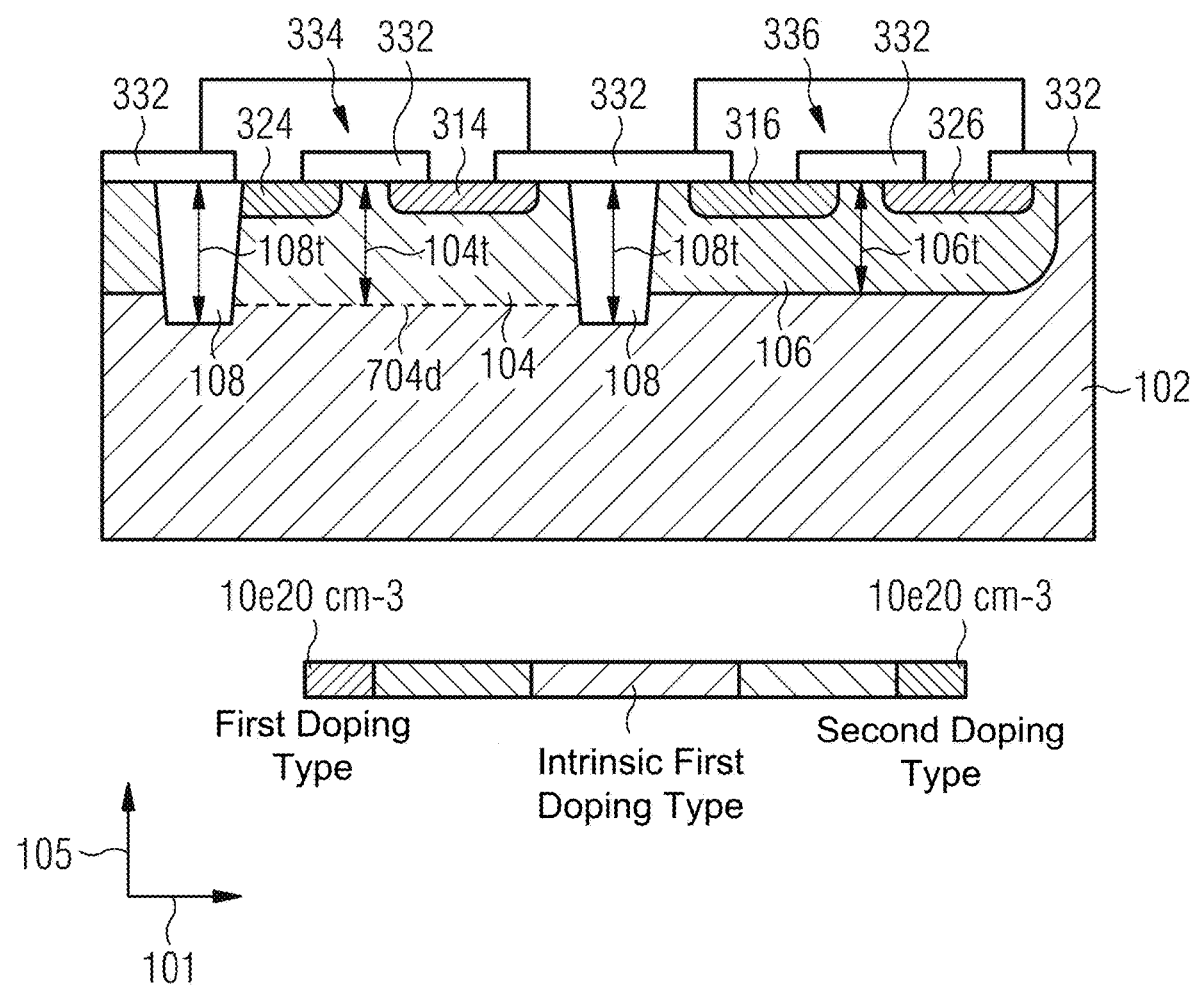
FIG. 7A shows an exemplary doping regime of an electrostatic discharge protection structure in a schematic cross-sectional view, according to various embodiments.

FIG. 7A illustrates a schematic doping regime for the ESD protection structure 100 in a cross-sectional view, according to various embodiments. The doping concentration is illustrated for both n-type (e.g. second doping type) and p-type (e.g. first doping type), semiconductor layer 102 intrinsic p-type doping (e.g. intrinsic first doping type).

According to various embodiments, the isolation structure 108 may have a depth 108*t* in the range from about 0.5 μm to about 2 μm. The first well region 104 may have a depth 104*t* in the range from about 0.5 μm to about 2 μm. The second well region 106 may have a depth 106*t* in the range from about 0.5 μm to about 2 μm. The depth 106*t* of the second well region 106 may be less than the depth 104*t* of the first well region 104. The depth 106*t* of the second well region 106 may be less than the depth 108*t* of the isolation structure 108.

The depth 108*t* of the isolation structure 108 may be determined by measuring the vertical extension of the isolation structure 108. In other words, the depth 108*t* of the isolation structure 108 may be defined by the respective electrically insulating (i.e. dielectric) material disposed within the semiconductor material of the semiconductor layer 102. The depth 104*t*, 106*t* of the respective well regions 104, 106 may be determined based on their doping profile, e.g. based on the respective vertical doping profile. The respective depth of the well regions 104, 106 may be defined at the level, where the doping concentration of the well regions 104, 106 approximates the doping concentration of the semiconductor layer 102. In other words, the extensions of the well regions 104, 106 may be defined by their doping concentration relative to the doping concentration of the semiconductor layer 102. A threshold doping concentration (with reference to the respective doping type)

equal to the doping concentration of the semiconductor layer 102, e.g. 1e14 cm-3 or less, may be used to define the respective well regions 104, 106 having a doping concentration greater than the threshold doping concentration with reference to the respective doping type.

Figure 7B:
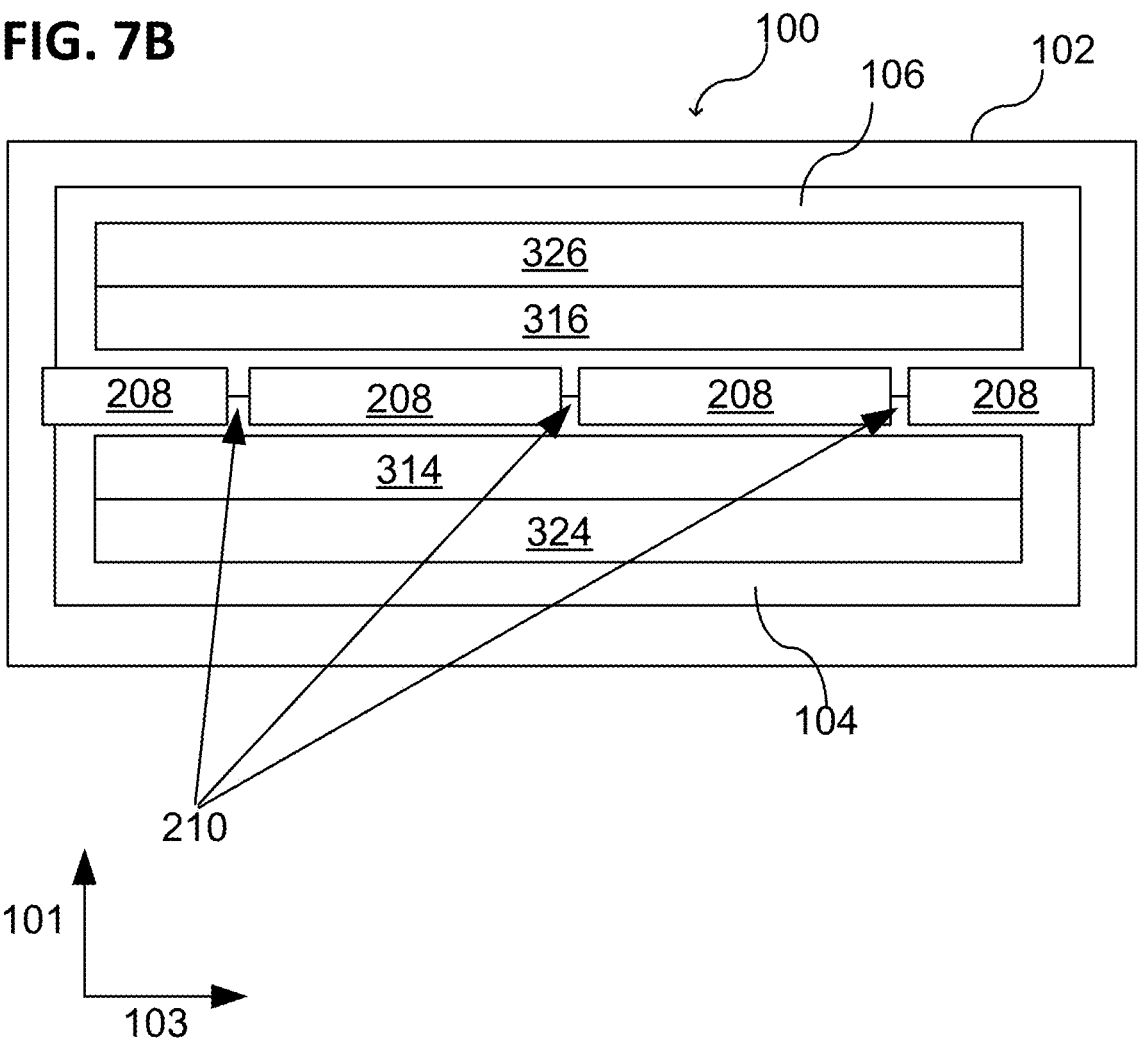
FIGS. 7B and 7C schematically show an electrostatic discharge protection structure in a top view and in a detailed view, according to various embodiments.
Figure 7C:
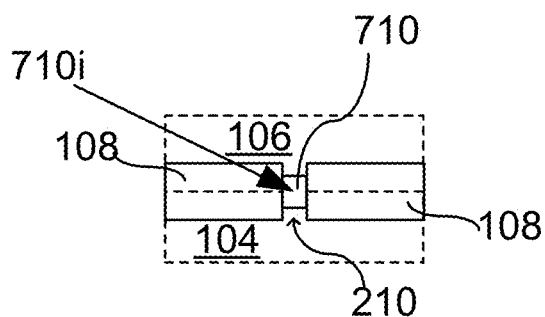

FIG. 7B shows an ESD protection structure 100 in a top view, according to various embodiments. The semiconductor layer 102 may include a plurality of trigger regions 210 defined by the respective gaps between the isolation structure elements 208 of the isolation structure 108, as already described. According to various embodiments, a trigger implantation 710i may be used to form a trigger implant region 710 in the respective trigger region 210, as illustrated in a detailed schematic view in FIG. 7C. According to various embodiments, at least one trigger implantation may be used to generate at least one pn-junction in each of the trigger regions 210 to couple the two well regions 104, 106 with each other. According to various embodiments, a plurality of trigger implantations may be used to generate a desired more complex trigger implant structure including more than one pn-junction in each of the trigger regions 210.

Figure 8A:
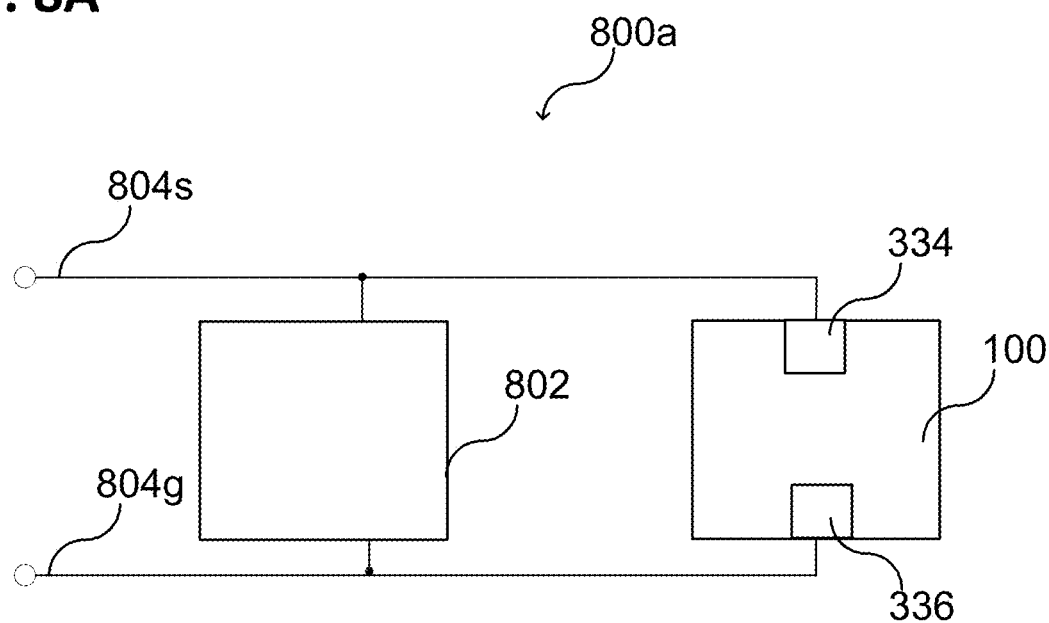
FIGS. 8A and 8B schematically show an electronic device including an electrostatic discharge protection structure, according to various embodiments.

FIG. 8A illustrates an electronic device 800a including an ESD protection structure 100 as described herein, e.g. a lateral or a vertical thyristor structure, according to various embodiments. The electronic device 800a may include an electronic circuit 802. The electronic circuit may include a first bus 804s (e.g. a supply bus) and a second bus 804g (e.g. a ground bus). Further, the electronic circuit 802 may be configured to be operated by a first electric potential at the first bus 804s and by a second electric potential lower than the first electric potential at the second bus 804g. The ESD protection structure 100 may be coupled between the first bus 804s and the second bus 804g to protect the electronic circuit 802 from an electrostatic discharge event. As described above (cf. FIG. 3B or FIG. 3D), the first electrically conductive contact structure 334 of the ESD protection structure 100 may be coupled to the first bus 804s and the second electrically conductive contact structure 336 of the ESD protection structure 100 may be coupled to the second bus 804g.

Figure 8B:
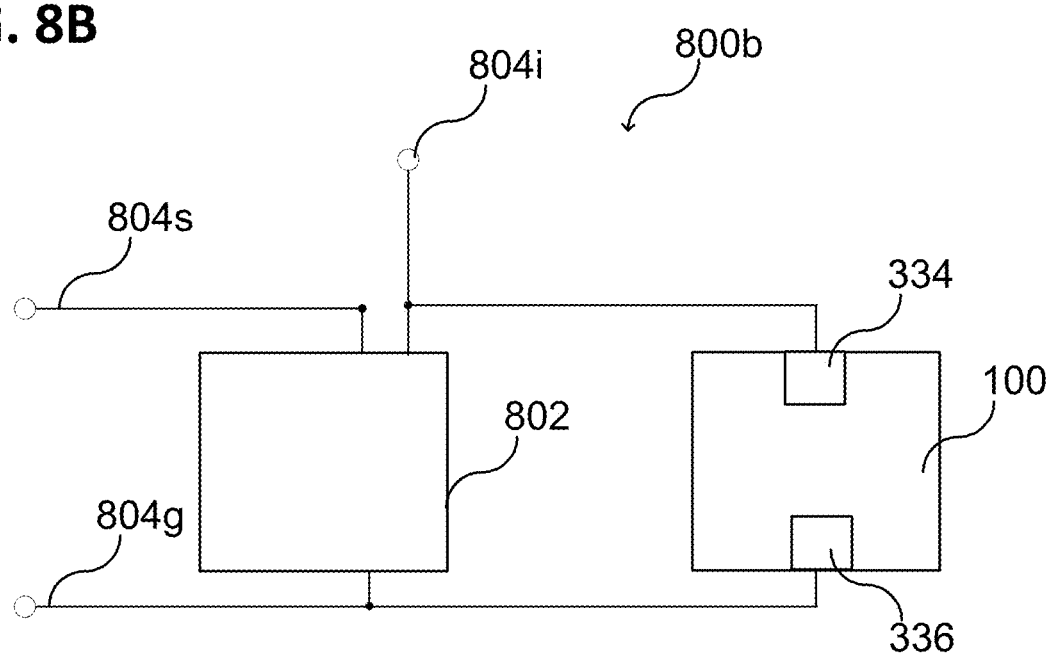

FIG. 8B illustrates an electronic device 800b including an ESD protection structure 100 as described herein, e.g. a lateral or a vertical thyristor structure, according to various embodiments. The electronic device 800b may include an electronic circuit 802. The electronic circuit including a first bus 804s (e.g. a supply bus), a second bus 804g (e.g. a ground bus), and an I/O-pad 804i. The electronic circuit 802 may be configured to be operated by a first electric potential at the first bus 804s and by a second electric potential lower than the first electric potential at the second bus 804g. According to various embodiments, the ESD protection structure 100 may be coupled at least between the I/O-pad 804i and the second bus 804g to protect the electronic circuit 802 from an electrostatic discharge event at least between the I/O-pad 804i and the ground bus 804g. As described above (cf. FIG. 3B or FIG. 3D), the first electrically conductive contact structure 334 may be coupled to the I/O-pad 804i and the second electrically conductive contact structure 336 may be coupled to the second bus 804g.

Various modifications of the electronic devices 800a, 800b may be made to include one or more of the ESD protection structures 100 described herein, e.g. unidirectional or bi-directional, to protect an electronic circuit 802 from an ESD event. The ESD protection structure 100 may for example connect two contacts of the electronic circuit 802 with each other. The ESD protection structure 100 may be coupled in parallel to the electronic circuit 802.

FIGS. 9A to 9E show a vertical ESD protection structure 900a and a vertical thyristor structure 900b in various schematic views, according to various embodiments. The vertical ESD protection structure 900a and the vertical thyristor structure 900b respectively include an isolation structure 908 laterally surrounding a doped region 904 in a semiconductor layer similar to the isolation structure 108 laterally surrounding for example the first well region 104 of the lateral ESD protection structure 100 or lateral thyristor structure 100 described before.

Figure 9A:
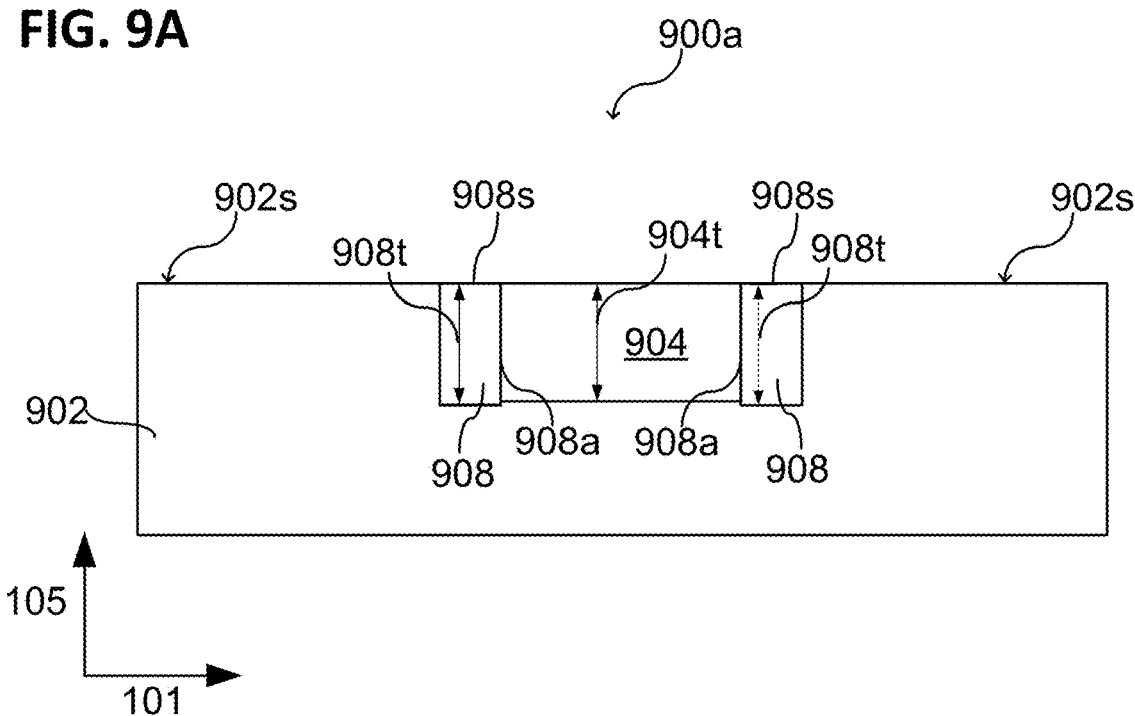
FIGS. 9A to 9F schematically show a vertical thyristor structure in various views, according to various embodiments.

FIG. 9A illustrates a vertical ESD protection structure 900a in a schematic cross-sectional view, according to various embodiments. The vertical ESD protection structure 900a includes a semiconductor layer 902 (also referred to as first semiconductor layer 902) doped with a dopant of a first doping type. The semiconductor layer 902 may be a low-doped layer, e.g. with a doping concentration of less than about 1e14 cm-3, as described above with reference to semiconductor layer 102. The vertical ESD protection structure 900a further includes a region 904 (also referred to as first region 904) extending from a surface 902s of the semiconductor layer 902 into the semiconductor layer 902. The region is doped with a dopant of a second doping type opposite the first doping type. According to various embodiments, the vertical ESD protection structure 900a includes an isolation structure 908 extending from the surface 902s of the semiconductor layer 902 into the semiconductor layer 902 and laterally surrounding the region 904. The isolation structure 908 may partially or completely laterally surround the region 904. Further, the isolation structure 908 may have a depth 908t similar to the depth 904t of the region 904.

According to various embodiments, the isolation structure 908 may have at least one sidewall 908a in contact with or facing the region 904. The isolation structure 908 may have a surface 908s exposed at the surface 902s of the semiconductor layer 902. According to various embodiments, the vertical ESD protection structure 900a may be configured in a similar way as the lateral ESD protection structure 100 described before, e.g. region 904 may correspond to the first well region 104.

Figure 9B:
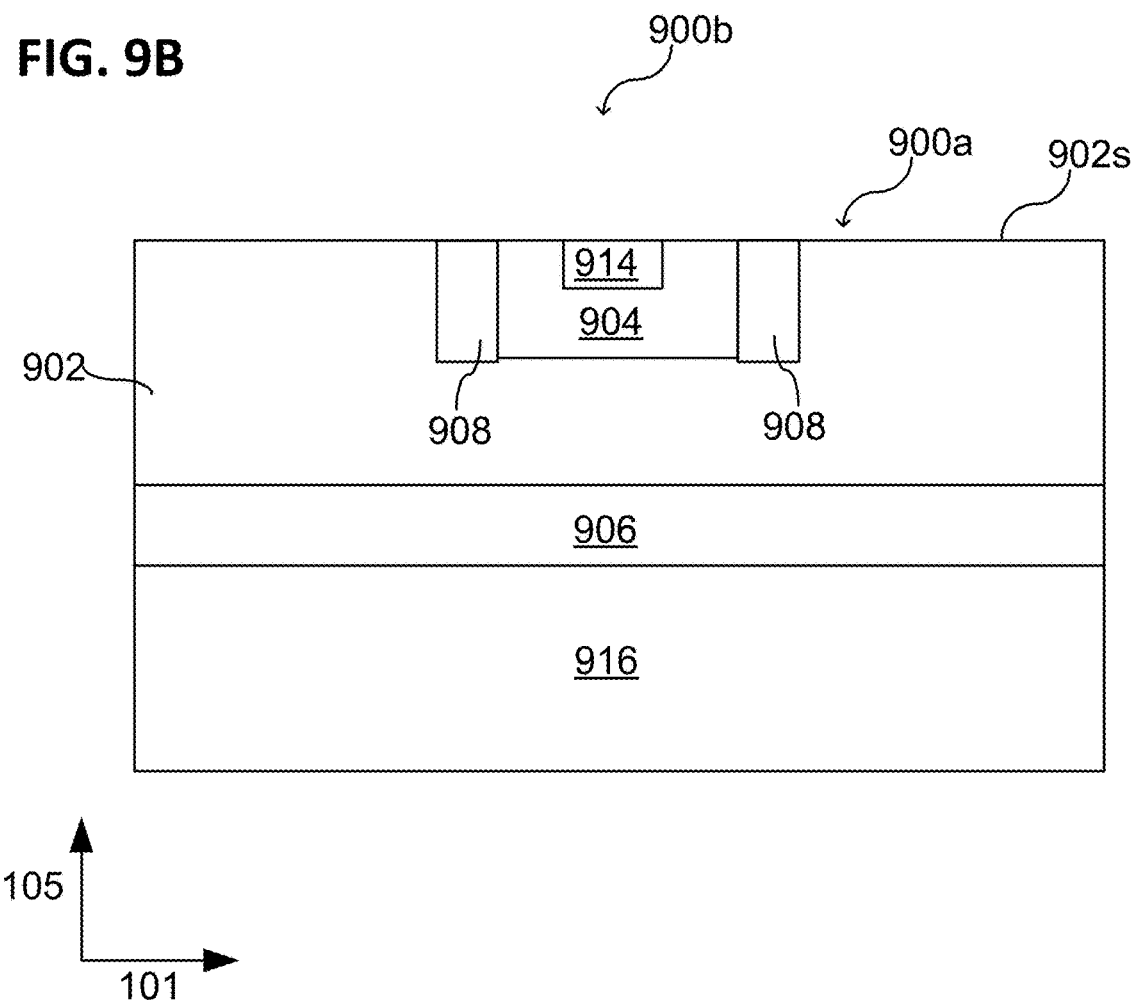

FIG. 9B illustrates a vertical thyristor structure 900b in a schematic cross-sectional view, according to various embodiments. The vertical thyristor structure 900b may include the vertical ESD protection structure 900a described in FIG. 9A.

According to various embodiments, the vertical thyristor structure 900b may include a first semiconductor layer 902 doped with a dopant of a first doping type, a second semiconductor layer 906 doped with a dopant of the first doping type (e.g. with a higher doping concentration than the first semiconductor layer 902), and a third semiconductor layer 916 doped with a dopant of a second doping type opposite the first doping type (e.g. with a higher doping concentration than the first semiconductor layer 902). The semiconductor layers 902, 906, 906 may be provided as a layer stack. The first semiconductor layer 902 is disposed over the second semiconductor layer 906 and the second semiconductor layer 906 is disposed over the third semiconductor layer 916, as illustrated in FIG. 9B, according to various embodiments.

The vertical thyristor structure 900b may further include a first region 904 extending from a surface 902s of the first semiconductor layer 902 into the first semiconductor layer 902. The first region 904 is doped with a dopant of the second doping type. The vertical thyristor structure 900b may further include a second region 914 doped with a dopant of the first doping type and disposed within the first region 904. The vertical thyristor structure 900*b* may further include an isolation structure 908 extending from the surface 902*s* of the first semiconductor layer 902 into the first semiconductor layer 902 and laterally surrounding the first region 904.

According to various embodiments, first region 904 and the second region 914 form a first pn-junction of the vertical thyristor structure 900*b*. As illustrated in FIG. 9B, the first region 904 and the first semiconductor layer 902 form a second pn-junction of the vertical thyristor structure 900*b*. In the case that the second semiconductor layer 906 adjoins the first region 904, the first region 904 and the second semiconductor layer 906 form the second pn-junction of the vertical thyristor structure 900*b* (cf. FIG. 9E). Further, the second semiconductor layer 906 and the third semiconductor layer 916 form a third pn-junction of the vertical thyristor structure. Therefore, according to various embodiments, the first region 904, the second region 914, and the semiconductor layers 902, 906, 916 together form a vertical pnpn-junction structure or npnp-junction structure.

According to various embodiments, the second region 914 extends from the 902*s* surface of the first semiconductor layer 902 into the first region 904. The second semiconductor layer 906 may have a dopant concentration greater than a dopant concentration of the first semiconductor layer 902. The second semiconductor layer 906 may be a buried layer. According to various embodiments, the third semiconductor layer 916 may be a single crystalline semiconductor substrate, e.g. a semiconductor wafer, e.g. a silicon wafer. In this case, the first semiconductor layer 902 and the second semiconductor layer 906 may be epitaxial layers (epitaxially) grown on the single crystalline semiconductor substrate 916.

As described herein, the isolation structure 908 may include or consist of a first material having a first relative permittivity. The first semiconductor layer 902 may include or consist of a second material having a second relative permittivity. The first relative permittivity is less than the second relative permittivity. Therefore, the capacitance of the vertical ESD protection structure 900*a* or of the vertical thyristor structure 900*b* may be reduced, as described herein. According to various embodiments, the second material may be silicon, or any other suitable semiconductor material. The first material may be silicon oxide or any other suitable (e.g. low-k) dielectric material having less relative permittivity than the semiconductor material of the first semiconductor layer 902, e.g. less relative permittivity than silicon.

Figure 9C:
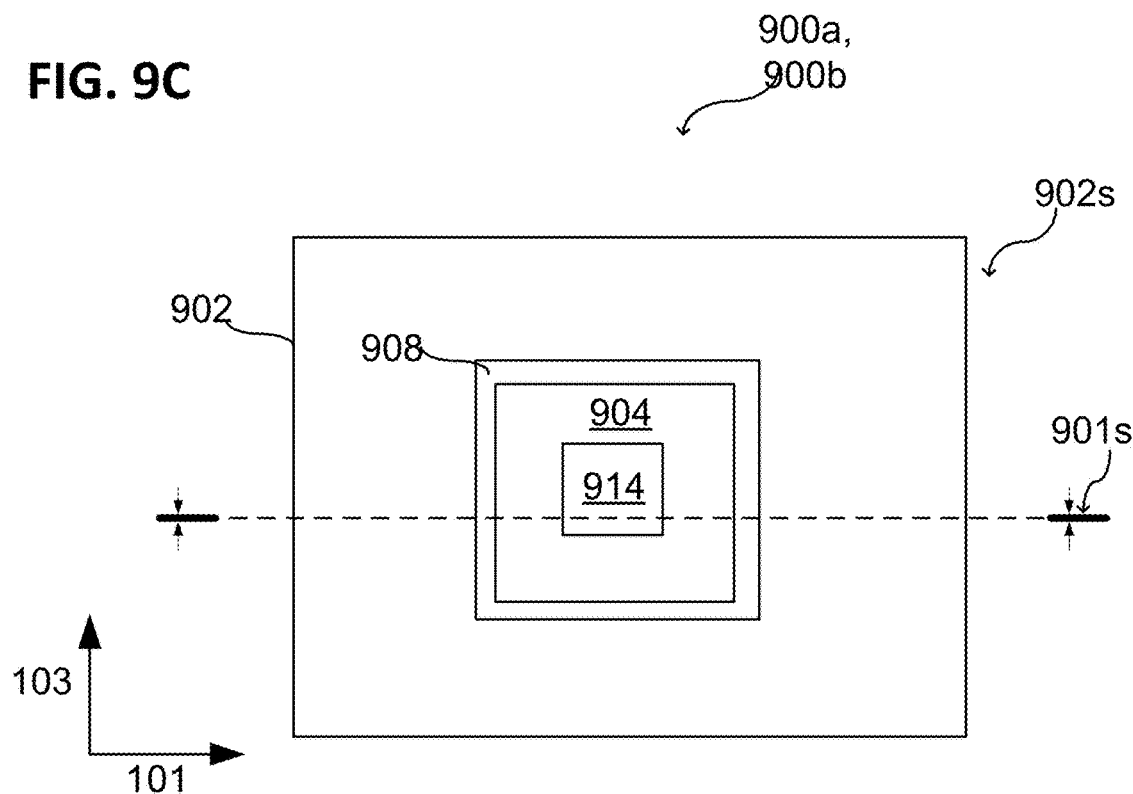

FIG. 9C illustrates the vertical ESD protection structure 900*a* or the vertical thyristor structure 900*b* in a schematic top view, according to various embodiments. The isolation structure 908 may completely laterally surround the first region 904. The first region 904 and the second region 914 may be electrically contacted from the top via a metallization disposed over the first semiconductor layer 902, as illustrated for example in FIG. 9D in a schematic cross-sectional view, according to various embodiments. The cross-sectional views illustrated in FIGS. 9A, 9B, 9D and 9E may be views along the cross-section 901*s* shown in FIG. 9C, according to various embodiments.

Figure 9D:
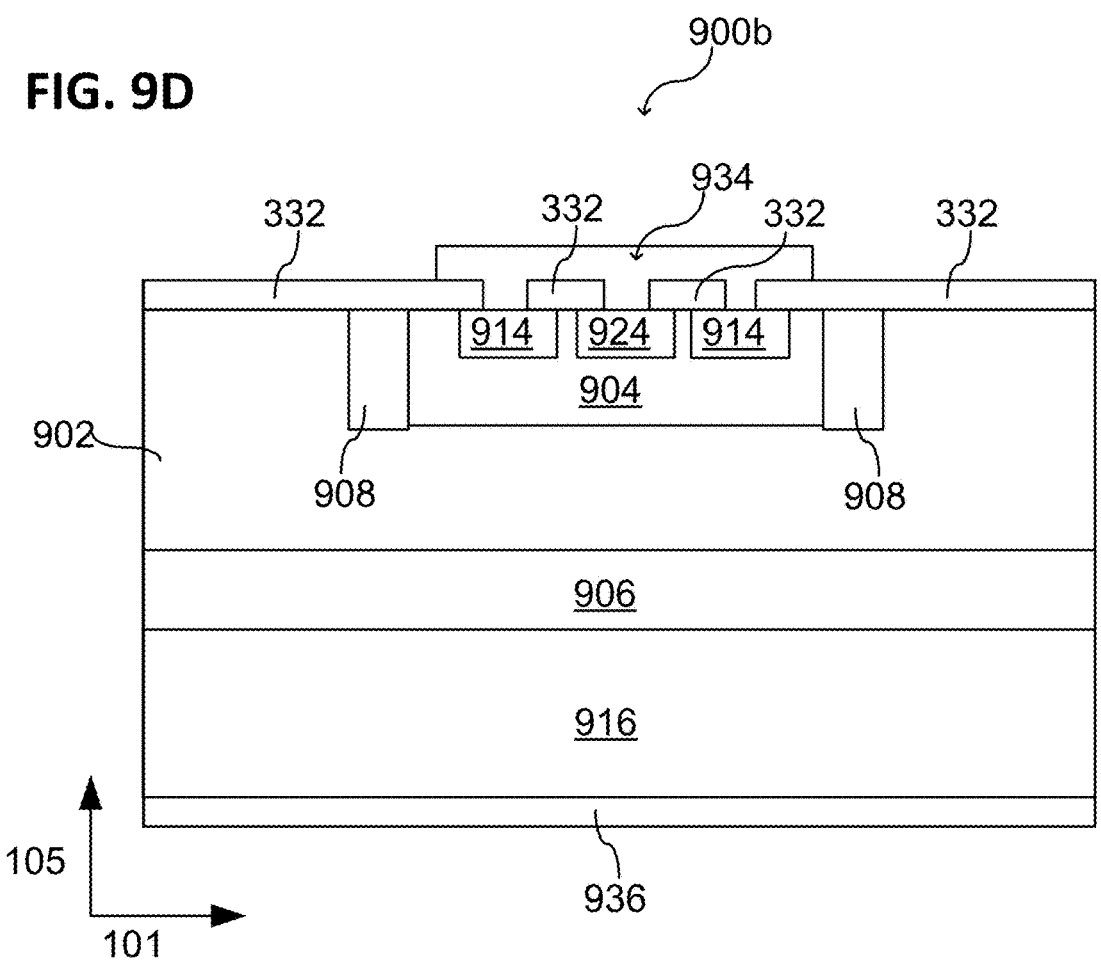

As illustrated in FIG. 9D, the vertical thyristor structure 900*b* may include a first contact region 924 disposed in the first region 904. The first contact region 924 may be doped with a dopant of the second doping type. The first contact region 924 may have a greater doping concentration than the first region 904. The vertical thyristor structure 900*b* may further include a first metallization structure 934 electrically contacting the second region 914 and the first contact region 924. In a similar way as described above with reference to the lateral thyristor structure 100, the first metallization structure 934 may be used to connect the vertical thyristor structure 900*b* to a supply bus or I/O-pad of an electronic circuit to protect the electronic circuit from an ESD event (cf. FIG. 8A).

The vertical thyristor structure 900*b* may further include a second metallization structure 936 electrically contacting the third semiconductor layer 916. In a similar way as described above with reference to the lateral thyristor structure 100, the second metallization structure 936 may be used to connect the vertical thyristor structure 900*b* to a ground bus of an electronic circuit to protect the electronic circuit from an ESD event (cf. FIG. 8B).

According to various embodiments, the second metallization 936 may further electrically contact the second semiconductor layer 906 (not illustrated). The second metallization 936 may include for example a vertical short or a via-metallization to electrically contact the second semiconductor layer 906.

Figure 9E:
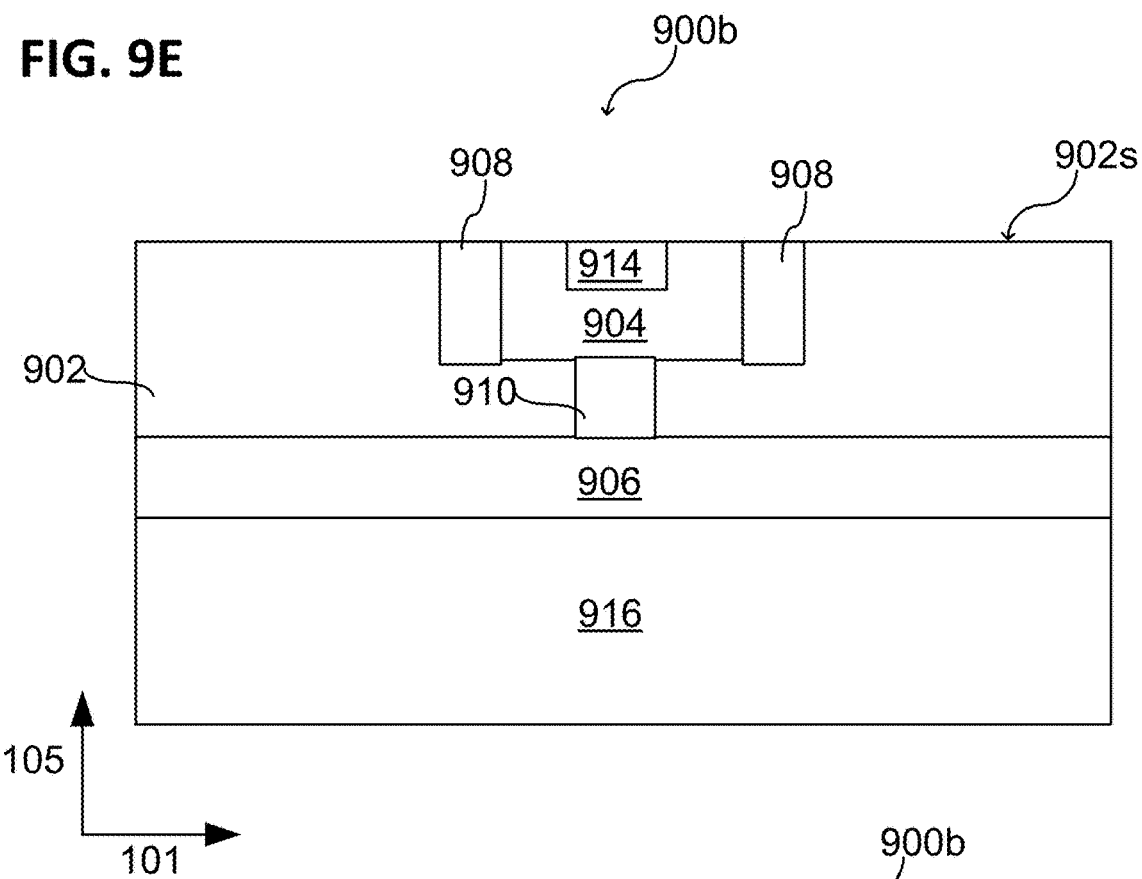

FIG. 9E illustrates a vertical thyristor structure 900*b* in a schematic cross-sectional view, according to various embodiments. The vertical thyristor structure 900*b* may be configured similarly to the vertical thyristor structure 900*b* described before. The vertical thyristor structure 900*b* may additionally include a third region 910 disposed between the first region 904 and the second semiconductor layer 906. The third region 910 may be doped with a dopant of the first doping type. A dopant concentration of the third region 910 may be greater than a dopant concentration of a portion of the first semiconductor layer 902 laterally surrounding the third region 910. The third region 910 may reduce the vertical breakdown voltage of the vertical thyristor structure 900*b*. The third region may adjoin the second semiconductor layer 906. The first semiconductor layer 902 may form a first portion of the second pn-junction with the first region 904 and the third region 910 may form a second portion of the second pn-junction with the first region 904. Alternatively, only the third region 910 may form the second pn-junction with the first region 904, e.g. if the third region 910 may have a width (along direction 101) equal to or greater than the width of the first region 904.

Figure 9F:
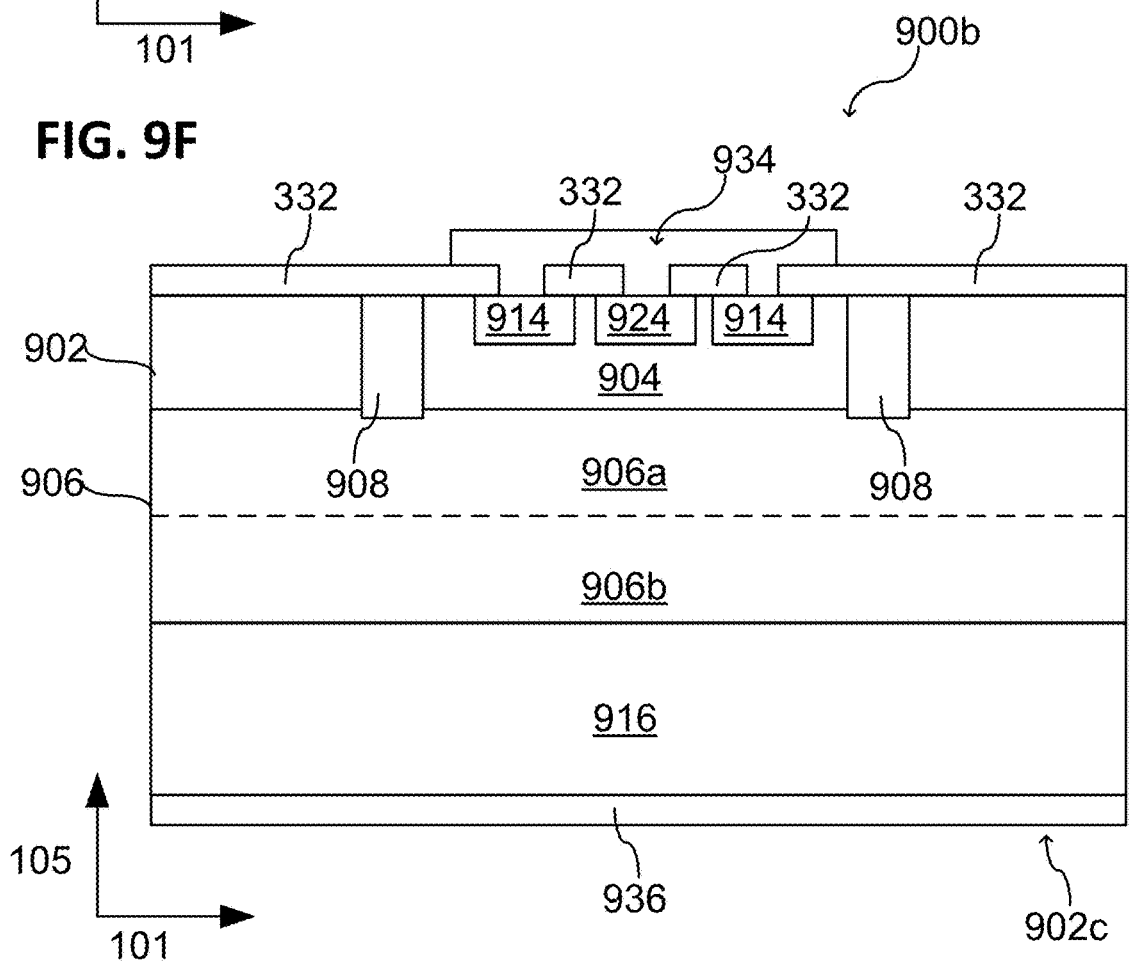

As illustrated in FIG. 9F in analogy to FIGS. 9A to 9E, an electrostatic discharge protection structure 900*b* may include: a carrier 902*c* including a first semiconductor layer 902 doped with a dopant of a first doping type, a first region 904 extending from a surface 902*s* of the first semiconductor layer 902 into the first semiconductor layer 902, the first region 904 doped with a dopant of a second doping type opposite the first doping type; an isolation structure 908 extending from the surface 902*s* of the first semiconductor layer 902 into the first semiconductor layer 902 and laterally separating the first region 904 from the first semiconductor layer 902; a second region 914 doped with a dopant of the first doping type and disposed within the first region 904 to form a first pn-junction; a second semiconductor layer 906 disposed within the carrier 902*c* and doped with a dopant of the first doping type, and a third semiconductor layer 916 disposed within the carrier 902*c* and doped with a dopant of the second doping type, the second semiconductor layer 906 is disposed at least between the first region 904 and the third semiconductor layer 916 to form a second pn-junction with the first region 904 and to form a third pn-junction with the third semiconductor layer 916, the first pn-junction, the second pn-junction, and the third pn-junction providing a vertical thyristor structure.

According to various embodiments, the second semiconductor layer may include a first portion 906a having a first dopant concentration and a second portion 906b having a second dopant concentration greater than the first dopant concentration. The first portion 906a of the second semiconductor layer 906 adjoins the first region to form the second pn-junction. The second portion 906b of the second semiconductor layer 906 adjoins the third semiconductor layer 916 to form the third pn-junction.

According to various embodiments, a doped region may be disposed between the second portion 906b of the second semiconductor layer 906 and the first region 904. The doped region may be doped with a dopant of the first doping type. A dopant concentration of the doped region may be greater than a dopant concentration of the first portion 906a of the second semiconductor layer 906. The first portion 906a of the second semiconductor layer 906 adjoins the first region 904 to form a first portion of the second pn-junction and the doped region adjoins the first region 904 to form a second portion of the second pn-junction (cf. doped region 910 in FIG. 9E). According to various embodiments, the doped region may adjoin the second portion 906b of the second semiconductor layer 906.

Figure 10A:
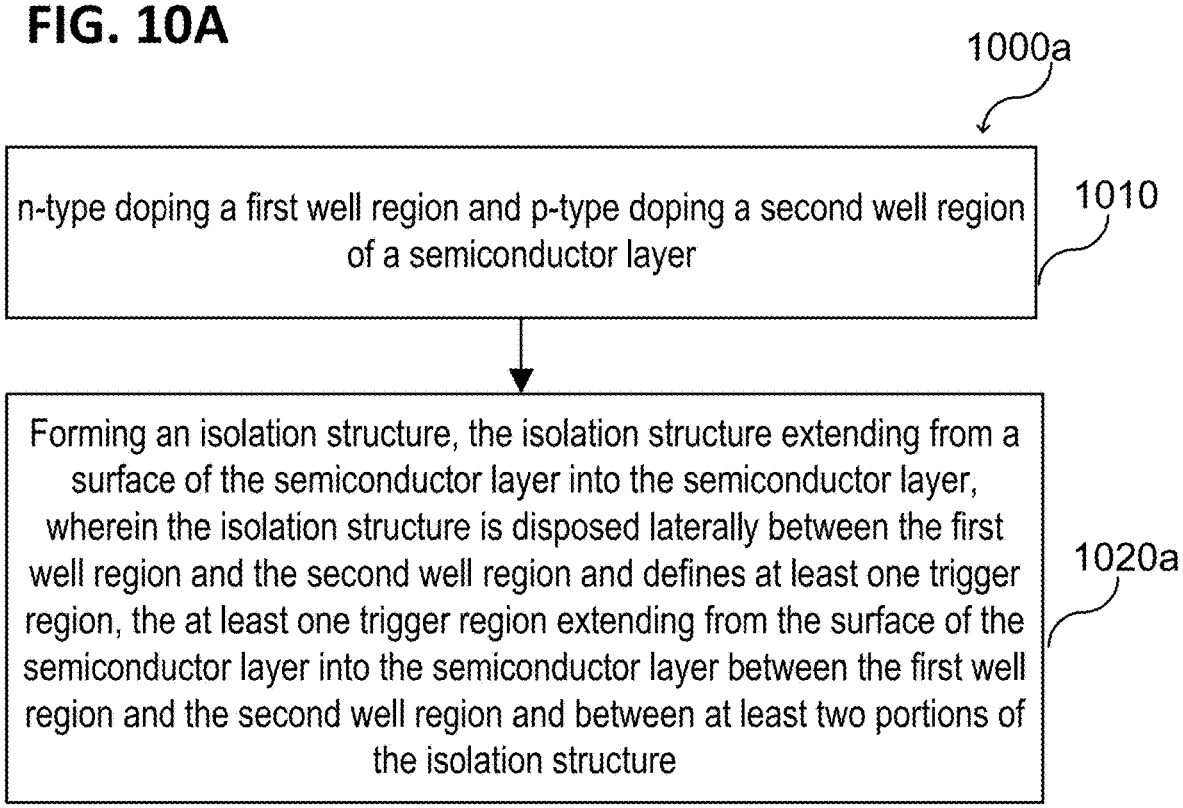
FIGS. 10A and 10B respectively show a flow diagram of a method for manufacturing an electrostatic discharge protection structure, according to various embodiments.

FIG. 10A illustrates a schematic flow diagram of a method 1000a for manufacturing an electrostatic discharge protection structure, according to various embodiments. The method 1000a may be carried out to provide the ESD protection structure 100 described herein. The method 1000a may include: in low, n-type doping a first well region 104, 106 and p-type doping a second well region 104, 106 of a semiconductor layer 102; and, in 1020a, forming an isolation structure 108, the isolation structure 108 extending from a surface 102s of the semiconductor layer 102 into the semiconductor layer, the isolation structure 108 laterally disposed between the first well region 104, 106 and the second well region 104, 106 (e.g. partially or completely) and defining at least one trigger region 110, the at least one trigger region 110 extending from the surface 102s of the semiconductor layer 102 into the semiconductor layer 102 between the first well region 104, 106 and the second well region 104, 106 and between at least two portions of the isolation structure 108.

Figure 10B:
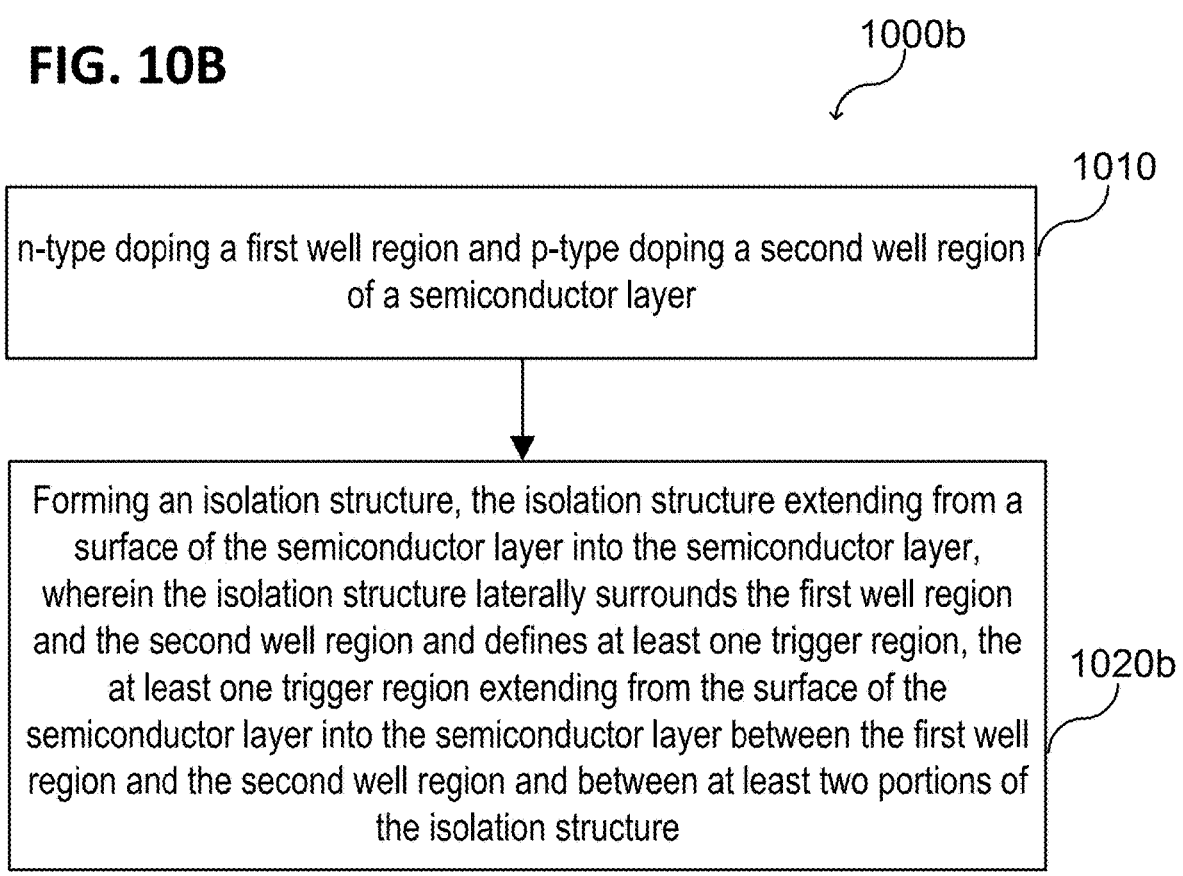

FIG. 10B illustrates a schematic flow diagram of a method 1000b for manufacturing an electrostatic discharge protection structure, according to various embodiments. The method 1000b may be carried out to provide the ESD protection structure 100 described herein. The method 1000b may include: in low, n-type doping a first well region 104, 106 and p-type doping a second well region 104, 106 of a semiconductor layer 102; and, in 1020b, forming an isolation structure 108, the isolation structure 108 extending from a surface 102s of the semiconductor layer 102 into the semiconductor layer, the isolation structure 108 laterally surrounding the first well region 104, 106 and/or the second well region 104, 106 (e.g. partially or completely) and defining at least one trigger region 110, the at least one trigger region 110 extending from the surface 102s of the semiconductor layer 102 into the semiconductor layer 102 between the first well region 104, 106 and the second well region 104, 106 and between at least two portions of the isolation structure 108.

Figure 11A:
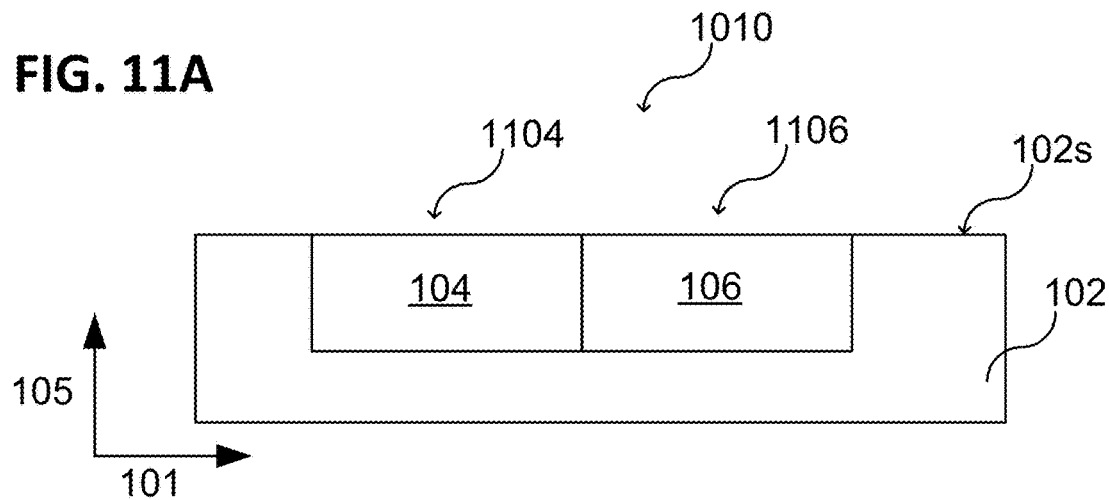
FIGS. 11 to 11H respectively show an electrostatic discharge protection structure at various stages during manufacturing in a schematic cross-sectional view, according to various embodiments.
Figure 11B:
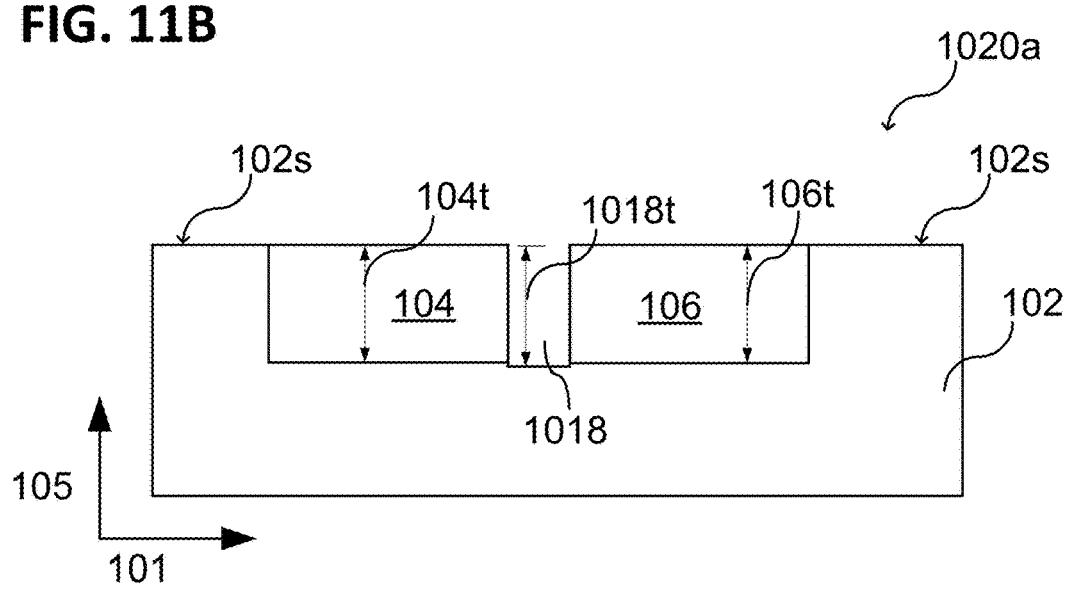
Figure 11C:
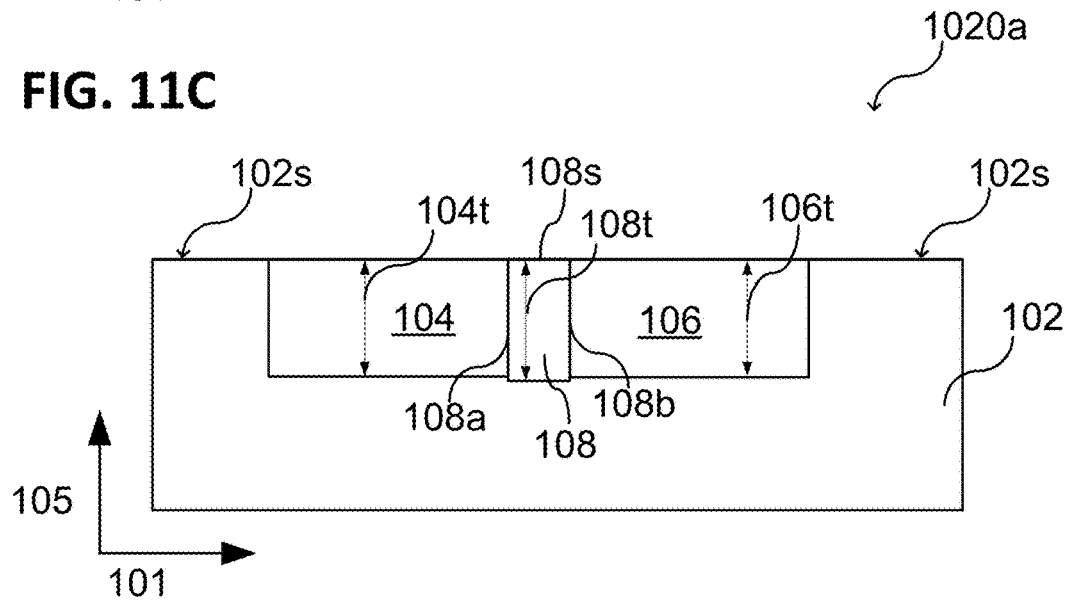

FIG. 11A, FIG. 11B, and FIG. 11C, illustrate an electrostatic discharge protection structure at various processing stages during manufacturing, e.g. during method 1000a is carried out.

As illustrated in FIG. 11A in a schematic cross-sectional view, two oppositely doped well regions 104, 106 may be formed in a semiconductor layer 102, as already described herein, e.g. with reference to FIG. 1A.

As illustrated in FIG. 11B and FIG. 11C in a schematic cross-sectional view, an isolation structure 108 may be formed at least between the two oppositely doped well regions 104, 106 by forming at least one trench structure 1018 into the semiconductor layer 102. Forming the at least one trench structure 1018 may include partially removing semiconductor material from the semiconductor layer 102. The trench structure 1018 may be formed with a depth 1018t similar to the depth of at least one of the two oppositely doped well regions 104, 106, as described above. Subsequently, the at least one trench structure 1018 may be filled with dielectric material having less relative permittivity than the semiconductor material that has been removed from the semiconductor layer 102 by forming the at least one trench structure 1018. The depth 1018t of the at least one trench structure 1018 may define the depth 108t of the isolation structure 108.

The method 1000a or the method 1000b may be adapted to provide any of the ESD protection structures 100 described herein. As an example, the at least one trench structure 1018 may also laterally surround the first well region 104 and/or the second well region 106, as described above.

Figure 11D:
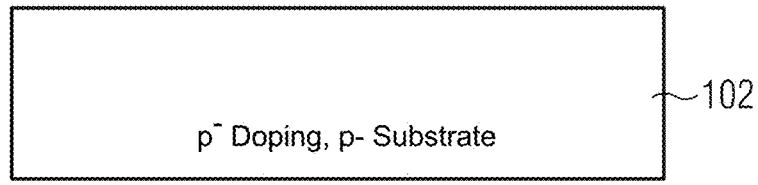
Figure 11E:
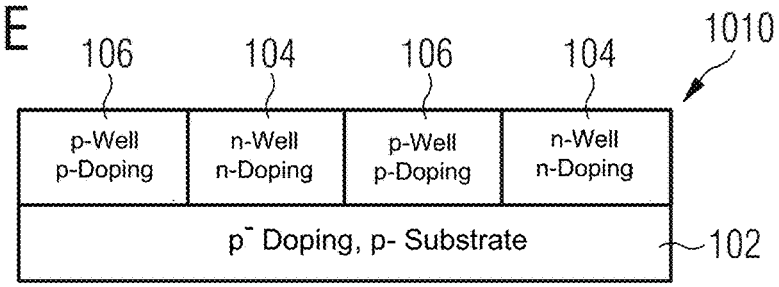

In a similar way, a plurality of well regions 104, 106 may be formed in the semiconductor layer 102 respectively laterally separated by the isolation structure 108, as illustrated in FIGS. 11D to 11H, according to various embodiments. A (e.g. p-type doped) semiconductor layer 102 may be additionally doped (a p-type substrate may be for example counter doped to provide an n-type region within the p-type substrate), e.g. by ion implantation, to provide first well regions 104 and second well region 106 laterally alternating, as illustrated in FIG. 11D and FIG. 11E in a schematic cross-sectional view respectively.

Figure 11F:
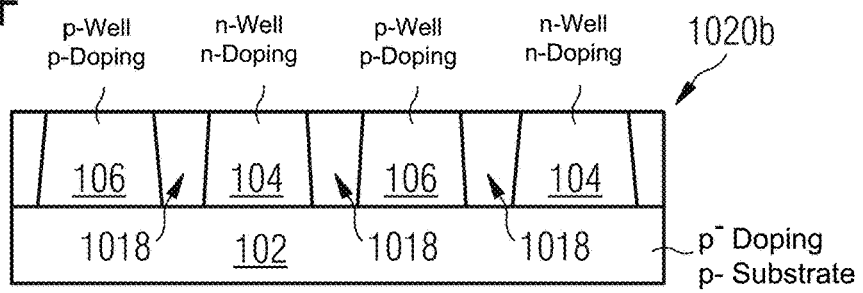
Figure 11G:
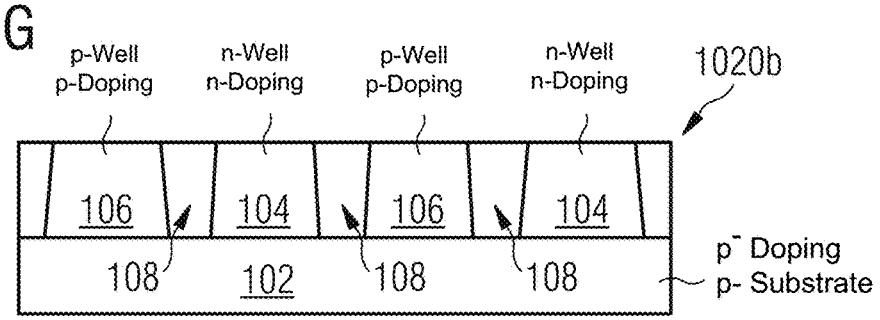
Figure 11H:
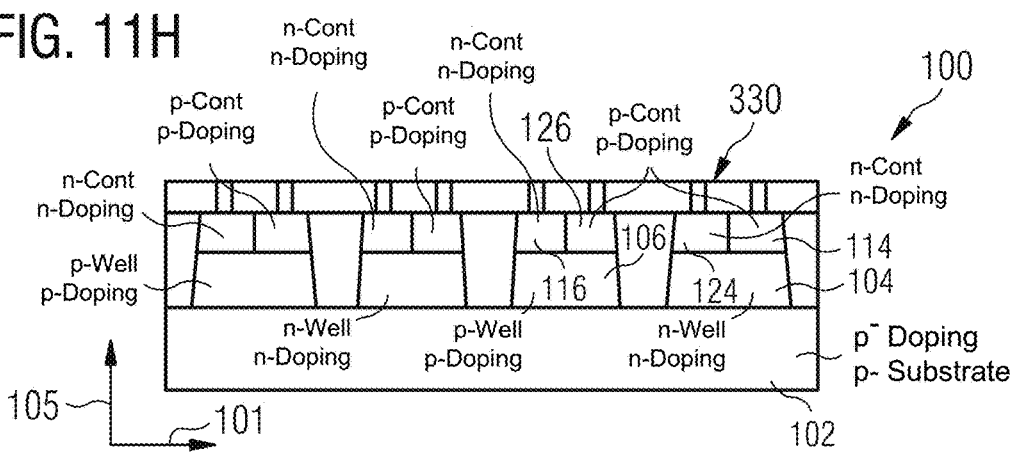

As illustrated in FIG. 11F and FIG. 11G in a respective schematic cross-sectional view, an isolation structure 108 may be formed extending laterally between each of the oppositely doped well regions 104, 106. Forming the isolation structure 108 may include forming at least one trench structure 1018 into the semiconductor layer 102 and filling the at least one trench structure 1018 with dielectric material, as described above. Afterwards, the ESD protection structure boo may be finalized, as illustrated in FIG. 11H (cf. for example FIG. 3D).

FIGS. 11A to 11H show a process flow which has the well region implantation before the replacement of the silicon region with non-conductive material.

FIG. 12 illustrates a schematic flow diagram of a method 1200 for manufacturing an electrostatic discharge protection structure, according to various embodiments. The method 1200 may be carried out to provide the ESD protection structure 100 described herein. The method 1200 may include: in 1210, forming an isolation structure 108 into a semiconductor layer 102, the isolation structure 108 extending from a surface 102s of the semiconductor layer 102 into the semiconductor layer 102, the isolation structure 108 laterally surrounding a first well region 104, 106 and/or a second well region 104, 106 and defining at least one trigger region 110, the at least one trigger region 110 extending from the surface 102s of the semiconductor layer 102 into the semiconductor layer 102 between the first well region 104, 106 and the second well region 104, 106 and between at least two regions of the isolation structure 108; and, in 1220, n-type doping the first well region 104, 106 and p-type doping the second well region 104, 106 using the isolation structure 108 as a doping mask.

Figure 13A:
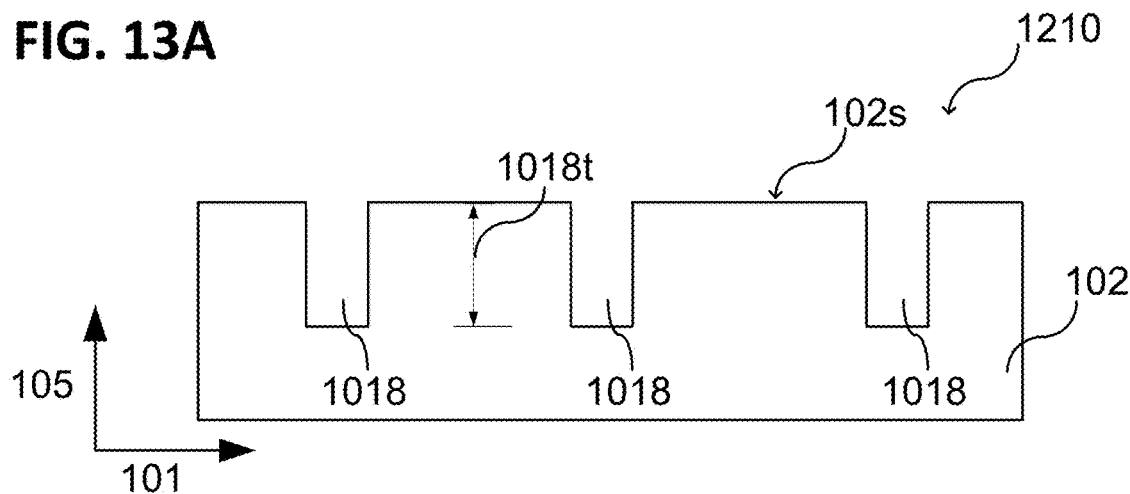
FIGS. 13A to 13H respectively show an electrostatic discharge protection structure at various stages during manufacturing in a schematic cross-sectional view, according to various embodiments.
Figure 13B:
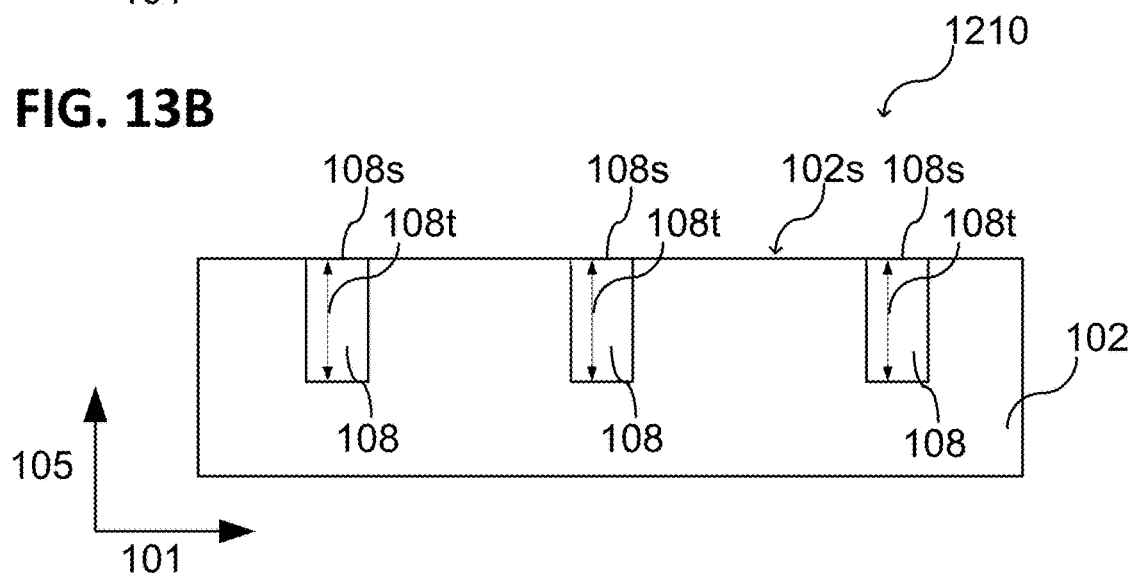
Figure 13C:
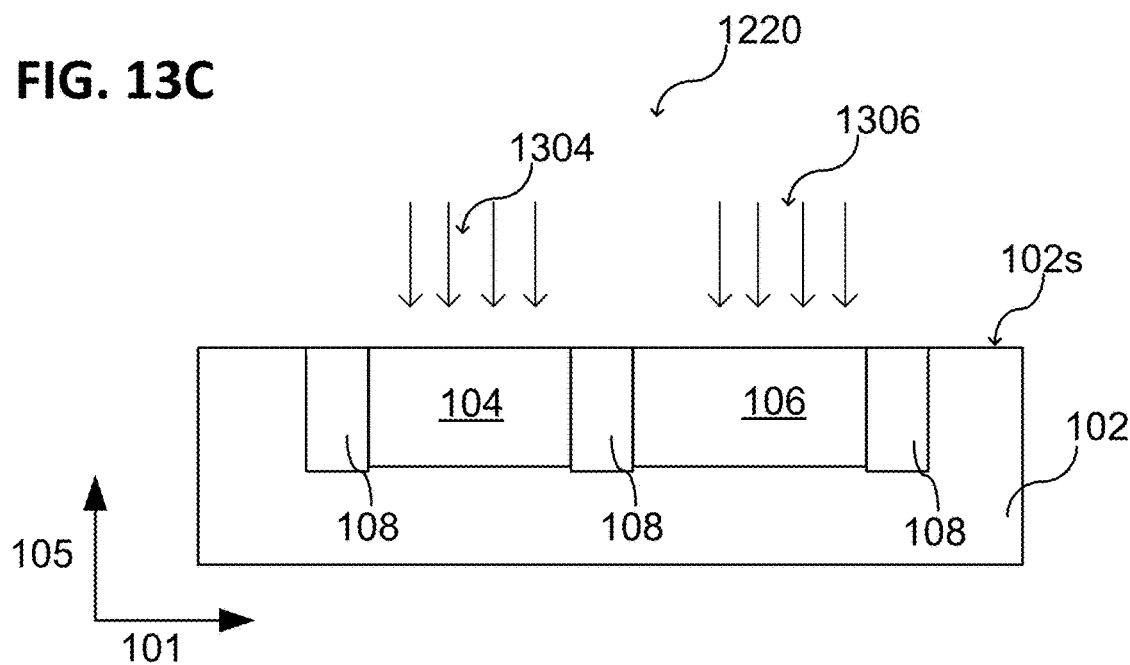
Figure 13D:
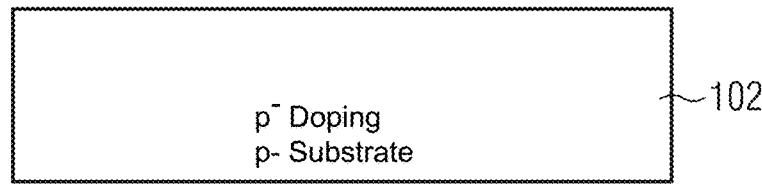
Figure 13E:
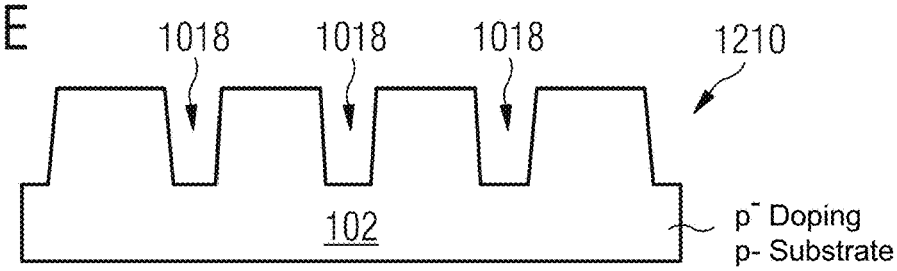
Figure 13F:
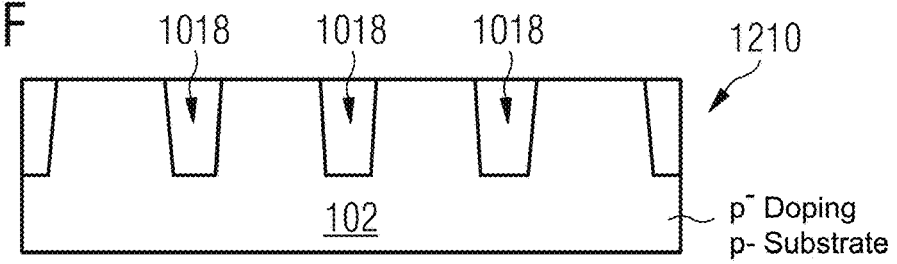
Figure 13G:
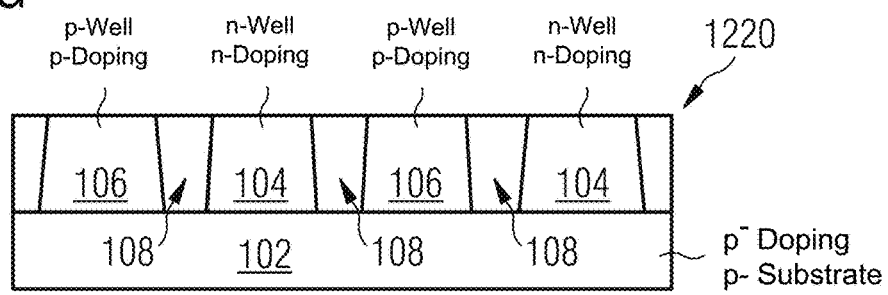
Figure 13H:
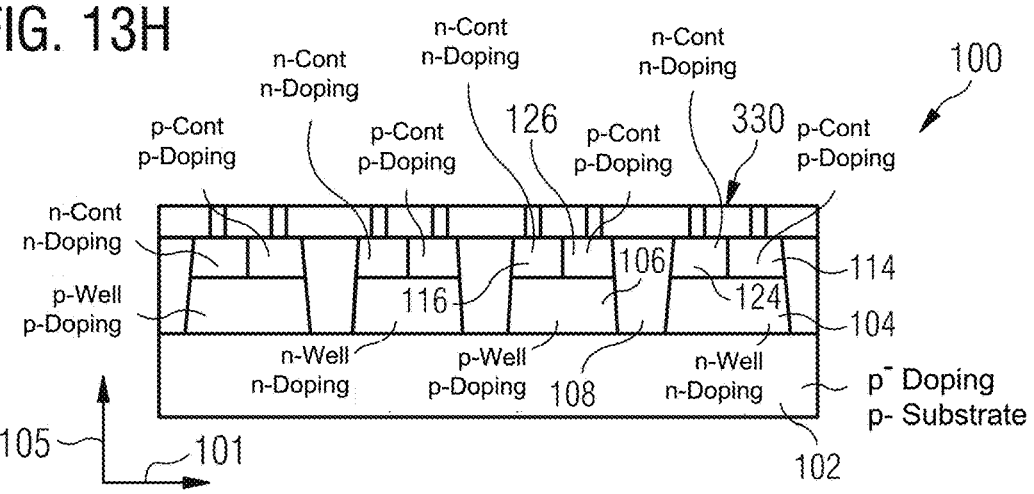

FIG. 13A, FIG. 13B, and FIG. 13C, illustrate the electrostatic discharge protection structure 100 at various processing stages during manufacturing, e.g. during method 1200 is carried out.

As illustrated in FIG. 13A and FIG. 13B in a schematic cross-sectional view, an isolation structure 108 may be formed into a semiconductor layer 102, e.g. by forming at least one trench structure 1018 into the semiconductor layer 102. Forming the at least one trench structure 1018 may include partially removing semiconductor material from the semiconductor layer 102. The trench structure 1018 may be formed with a predefined depth 1018t. Subsequently, the at least one trench structure 1018 may be filled with dielectric material having less relative permittivity than the semiconductor material that has been removed from the semiconductor layer 102 by forming the at least one trench structure 1018. The depth 1018t of the at least one trench structure 1018 may define the depth 108t of the isolation structure 108.

As illustrated in FIG. 13C, the isolation structure 108 may be used as a doping mask for forming at least two oppositely doped well regions 104, 106 laterally surrounded by the isolation structure 108. The formation of the respective well region 104, 106 may be therefore partially self-aligned, e.g. defined by the position of the isolation structure 108. The oppositely doped well regions 104, 106 may be formed by two ion-implantation processes 1304, 1306.

The method 1200 may be adapted to provide any of the ESD protection structures 100 described herein.

In a similar way, the isolation structure 108 laterally separating the respective well regions 104, 106 from each other may be formed into the semiconductor layer 102 before the well regions 104, 106 are implanted additionally into the semiconductor layer 102, as illustrated in the process flow in FIG. 13D to FIG. 13H, according to various embodiments. The isolation structure 108 may define at least positions of first well region 104 and second well region 106 laterally alternating in the semiconductor layer 102. As described above, the isolation structure 108 may at least partially assist the formation of the well regions 104, 106, since the isolation structure 108 laterally defines the shape and/or size of the well regions 104, 106. Therefore, the well regions 104, 106 can be formed at least partially self-aligned into the semiconductor layer 102 (e.g. by ion implantation).

FIGS. 13A to 13H show a process flow with the replacement of the silicon region with non-conductive material first, and, subsequently, the non-conductive material may serve as an additional implantation mask for the well implantations.

FIG. 14 illustrates a schematic flow diagram of a method 1400 for manufacturing a vertical thyristor structure, according to various embodiments. The method 1400 may be carried out to provide the vertical thyristor structure 900b described herein. The method 1400 may include: in 1410, forming a layer stack, the layer stack including a first semiconductor layer 902 doped with a dopant of a first doping type, a second semiconductor layer doped 906 with a dopant of the first doping type, and a third semiconductor layer 916 doped with a dopant of a second doping type opposite the first doping type, wherein the first semiconductor layer 902 is disposed over the second semiconductor layer 906 and wherein the second semiconductor layer 906 is disposed over the third semiconductor layer 916, in 1420, forming an isolation structure 908 into the first semiconductor layer 902, the isolation structure 908 extending from a surface 902s of the first semiconductor layer 902 into the first semiconductor layer 902, wherein the isolation structure 908 laterally surrounds a first region 904, and, in 1430, doping the first region 904 with a dopant of the second doping type using the isolation structure 908 as a doping mask.

Figure 15:
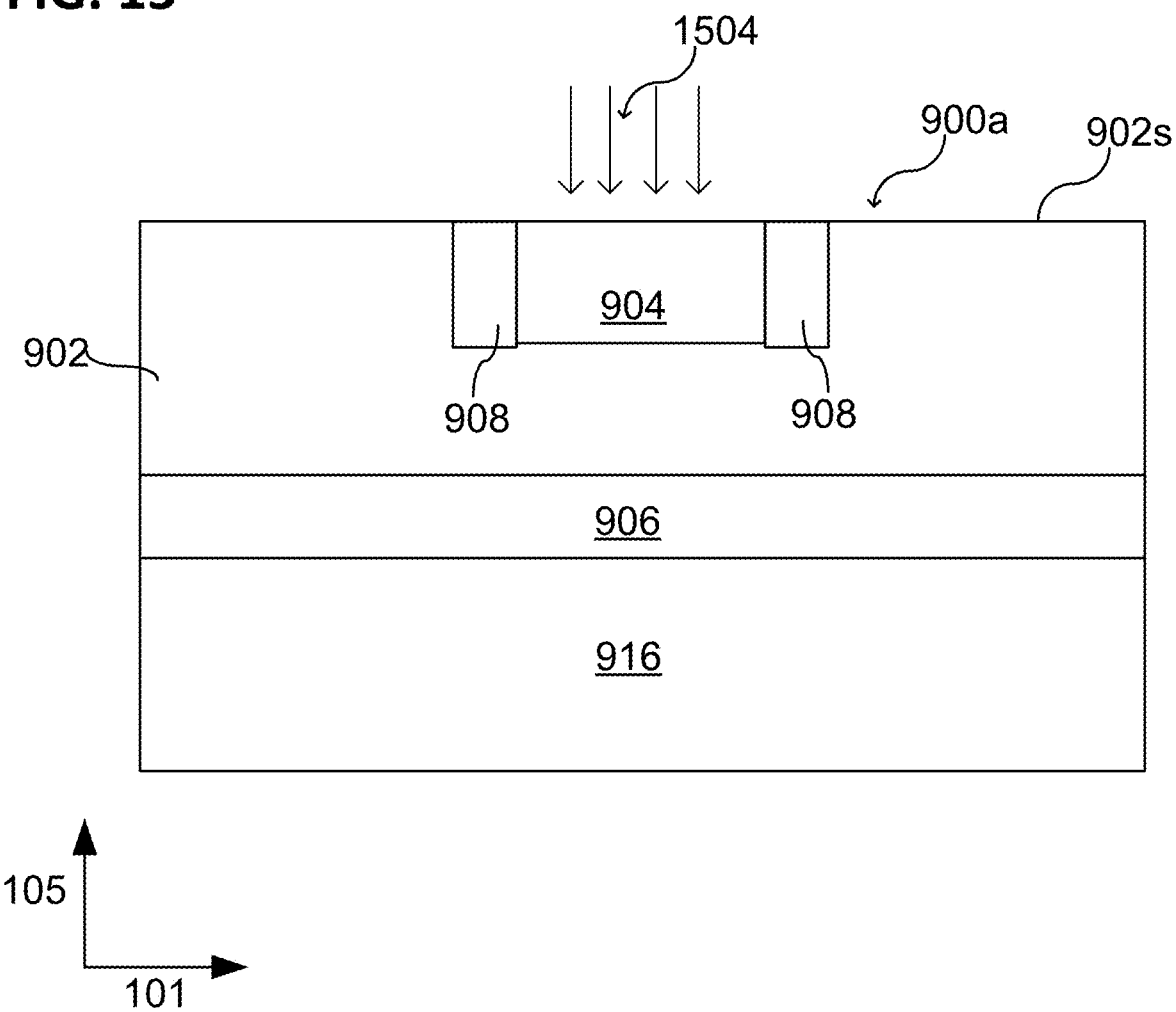
FIG. 15 shows a vertical thyristor structure during manufacturing in a schematic cross-sectional view, according to various embodiments.

FIG. 15 illustrates the vertical thyristor structure 900b at a processing stage during manufacturing, e.g. during method 1400 is carried out. The first region 904 may be formed by ion-implantation 1504. The isolation structure 908 may be used as a doping mask for ion-implantation 1504. The formation of the doped region 904, as described herein for example with reference to FIGS. 9A to 9E, may be therefore partially self-aligned, e.g. defined by the position of the isolation structure 908. The method 1400 may be adapted to provide any of the ESD protection structures 900a, 900b described herein.

According to various embodiments, a low-doped p-semiconductor layer may be used as substrate material, e.g. the first semiconductor layer 102, 902 may include low-doped p-semiconductor material. The substrate material may be structured, etched, and, subsequently, filled with non-conductive material, as described above. The non-conductive material may be used to precisely define the n-well and p-well regions of the lateral ESD protection structure 100 or the n-well region 904 of the vertical ESD protection structure 900a, 900b. The thickness/depth of the non-conductive material may be selected to avoid that implanted dopants reach the bulk silicon below the doped regions during ion-implantation.

According to various embodiments, one of two well regions may have the same doping type as the substrate material. The other well region may have the opposite doping type of the substrate material.

According to various embodiments, the respective resist masks used for the well implantations may be close to each other or may overlap each other. The n- and p-contact regions may be implanted into each of the well regions. The p-contact doping in the n-doped well region and the n-contact doping in the p-well doped region may have the shortest possible distance between each other. Optionally, a region with increased dopant concentration (e.g. a trigger implant region) may be formed in gaps of the non-conductive enclosure of the wells.

According to various embodiments, encapsulated n-well regions 104, 904 may be provided in a low-doped semiconductor layer 102, 902. The encapsulation is provided by non-conductive material reducing the lateral device capacitance. To provide a lateral thyristor structure, at least one lateral opening (one or more gaps) may be provided in the non-conductive material that enables the intrinsic triggering (e.g. the avalanche breakdown) at the well junction.

According to various embodiments, a process for manufacturing a lateral thyristor ESD structure is provided, cf. FIG. 10A to 13H, wherein the well regions are surrounded and defined by non-conductive material to achieve lowest possible capacitance per area, as described herein.

Example 1 is an electrostatic discharge protection structure including: a semiconductor layer doped with a dopant of a first doping type, a first well region extending from a surface of the semiconductor layer into the semiconductor layer, wherein the first well region is doped with a dopant of a second doping type opposite the first doping type; a second well region next to the first well region and extending from the surface of the semiconductor layer into the semiconductor layer, wherein the second well region is doped with a dopant of the first doping type; an isolation structure extending from the surface of the semiconductor layer into the semiconductor layer with a depth similar to the depth of at least one of the first well region or the second well region, wherein the isolation structure is arranged laterally adjacent to the first well region and the second well region.

In Example 2 the electrostatic discharge protection structure of Example 1 may optionally include that the isolation structure is segmented to provide at least one trigger region between the first well region and the second well region.

In Example 3 the electrostatic discharge protection structure of Example 2 may optionally include that the at least one trigger region includes semiconductor material.

In Example 4 the electrostatic discharge protection structure of Example 2 or 3 may optionally include that the first well region and the second well region adjoin each other in the at least one trigger region to form at least one pn-junction.

In Example 5 the electrostatic discharge protection structure of any one of Examples 2 to 4 may optionally include that the at least one trigger region is disposed between at least two portions of the isolation structure.

In Example 6 the electrostatic discharge protection structure of any one of Examples 2 to 5 may optionally include that the at least one trigger region extends from the surface of the semiconductor layer into the semiconductor layer.

In Example 7 the electrostatic discharge protection structure of any one of Examples 1 to 6 may optionally include that the isolation structure laterally surrounds the first well region and the second well region.

In Example 8 the electrostatic discharge protection structure of any one of Examples 1 to 7 may optionally include that the isolation structure includes a first material having a first relative permittivity and wherein the semiconductor layer includes a second material having a second relative permittivity, wherein the first relative permittivity is less than the second relative permittivity.

In Example 9 the electrostatic discharge protection structure of Example 8 may optionally include that the second material is silicon.

In Example 10 the electrostatic discharge protection structure of Example 8 or 9 may optionally include that the first material is silicon oxide.

In Example 11 the electrostatic discharge protection structure of any one of Examples 1 to 10 may optionally further include: a first doped region disposed within the first well region and doped with a dopant of the first doping type.

In Example 12 the electrostatic discharge protection structure of Example 11 may optionally further include: a second doped region disposed within the second well region and doped with a dopant of the second doping type.

In Example 13 the electrostatic discharge protection structure of Example 12 may optionally include that the first doped region, the second doped region, the first well region, and the second well region are arranged relative to each other as a lateral thyristor structure.

In Example 14 the electrostatic discharge protection structure of Example 12 or 13 may optionally include that a dopant concentration of the first doped region is greater than a dopant concentration of the first well region and that a dopant concentration of the second doped region is greater than a dopant concentration of the second well region.

In Example 15 the electrostatic discharge protection structure of any one of Examples 1 to 14 may optionally further include: a first contact region disposed in the first well region, wherein the first contact region is doped with a dopant of the second doping type.

In Example 16 the electrostatic discharge protection structure of Example 15 may optionally further include: a second contact region disposed in the second well region, wherein the second contact region is doped with a dopant of the first doping type.

In Example 17 the electrostatic discharge protection structure of Example 16 may optionally include that a dopant concentration of the first contact region is greater than a dopant concentration of the first well region and that a dopant concentration of the second contact region is greater than a dopant concentration of the second well region.

In Example 18 the electrostatic discharge protection structure of any one of Examples 1 to 17 may optionally include that a dopant concentration of the semiconductor layer is less than a dopant concentration of the first well region and second well region.

In Example 19 the electrostatic discharge protection structure of any one of Examples 1 to 18 may optionally further include: a semiconductor substrate layer, wherein the semiconductor substrate layer is doped with a dopant of the first doping type and wherein the semiconductor layer is an epitaxial layer grown on the semiconductor substrate layer.

In Example 20 the electrostatic discharge protection structure of Example 19 may optionally include that a dopant concentration of the semiconductor substrate layer is greater than a dopant concentration of the semiconductor layer.

In Example 21 the electrostatic discharge protection structure of Example 20 or 20 may optionally further include: a vertical breakdown region disposed between the first well region and the semiconductor substrate layer, wherein the vertical breakdown region is doped with a dopant of the second doping type.

In Example 22 the electrostatic discharge protection structure of Example 16 or 17 may optionally further include: a first metallization structure electrically contacting the first doped region and the first contact region, and a second metallization structure electrically contacting the second doped region and the second contact region.

In Example 23 the electrostatic discharge protection structure of Example 22 may optionally include that the first metallization structure further includes an I/O-pad coupled to the first doped region and the first contact region.

In Example 24 the electrostatic discharge protection structure of Example 22 or 23 may optionally include that the second metallization structure further includes a ground bus coupled to second doped region and the second contact region.

Example 25 is an electronic device including: an electronic circuit, the electronic circuit including a supply bus, a ground bus, and an I/O-pad, the electronic circuit is configured to be operated by a first electric potential at the ground bus and by a second electric potential higher than the first electric potential at the supply bus, and an electrostatic discharge protection structure according to any one of Examples 1 to 24 coupled between the I/O-pad and the ground bus to protect the electronic circuit from an electrostatic discharge event. Alternatively, Example 25 is an electronic device including: an electronic circuit, the electronic circuit including a supply bus and a ground bus, the electronic circuit is configured to be operated by a first electric potential at the ground bus and by a second electric potential higher than the first electric potential at the supply bus, and an electrostatic discharge protection structure according to any one of Examples 1 to 24 coupled between the supply bus and the ground bus to protect the electronic circuit from an electrostatic discharge event. Alternatively, Example 25 is an electronic device including: an electronic circuit; an electrostatic discharge protection structure according to any one of examples 1 to 24 coupled with the electronic circuit to protect the electronic circuit from an electrostatic discharge event.

Example 26 is an electrostatic discharge protection structure including: a semiconductor layer, an n-type doped first well region and a p-type doped second well region formed laterally adjacent to each other in the semiconductor layer; an isolation structure extending from a surface of the semiconductor layer into the semiconductor layer, wherein the isolation structure laterally surrounds the first well region and the second well region and is partially disposed between the first well region and the second well region, wherein the isolation structure defines at least one trigger region, the at least one trigger region extending from the surface of the semiconductor layer into the semiconductor layer between the first well region and the second well region and between at least two portions of the isolation structure.

Example 27 is an electrostatic discharge protection structure including: a semiconductor layer including an n-type doped region extending from a surface of the semiconductor layer into the semiconductor layer; a p-type doped region extending from the surface of the semiconductor layer into the semiconductor layer, the n-type doped region and the p-type doped region are disposed laterally adjacent to each other; an isolation structure extending from the surface of the semiconductor layer into the semiconductor layer, wherein the isolation structure has a first sidewall structure adjoining the n-type doped region, a second sidewall structure opposite the first sidewall structure adjoining the p-type doped region, wherein the isolation structure is laterally segmented to provide at least one trigger region between at least two regions of the isolation structure, the trigger region extending from the surface of the semiconductor layer into the semiconductor layer between the n-type doped region and the p-type doped region, wherein the n-type doped region and the p-type doped region adjoining each other in the at least one trigger region forming at least one pn-junction.

Example 28 is a method for manufacturing an electrostatic discharge protection structure, the method including: n-type doping a first well region and p-type doping a second well region of a semiconductor layer; and forming an isolation structure, the isolation structure extending from a surface of the semiconductor layer into the semiconductor layer, wherein the isolation structure laterally surrounds the first well region and the second well region and defines at least one trigger region, the at least one trigger region extending from the surface of the semiconductor layer into the semiconductor layer between the first well region and the second well region and between at least two portions of the isolation structure.

Example 29 is a method for manufacturing an electrostatic discharge protection structure, the method including: forming an isolation structure into a semiconductor layer, the isolation structure extending from a surface of the semiconductor layer into the semiconductor layer, wherein the isolation structure laterally surrounds a first well region and a second well region and defines at least one trigger region, the at least one trigger region extending from the surface of the semiconductor layer into the semiconductor layer between the first well region and the second well region and between at least two regions of the isolation structure; and n-type doping the first well region and p-type doping the second well region using the isolation structure as a doping mask.

Example 30 is a vertical thyristor structure including: a first semiconductor layer doped with a dopant of a first doping type, a second semiconductor layer doped with a dopant of the first doping type, and a third semiconductor layer doped with a dopant of a second doping type opposite the first doping type, wherein the first semiconductor layer is disposed over the second semiconductor layer and wherein the second semiconductor layer is disposed over the third semiconductor layer, a first region extending from a surface of the first semiconductor layer into the first semiconductor layer, wherein the first region is doped with a dopant of the second doping type; a second region doped with a dopant of the first doping type and disposed within the first region, and an isolation structure extending from the surface of the first semiconductor layer into the first semiconductor layer and laterally surrounding the first region.

In Example 31 the vertical thyristor structure of Example 30 may optionally include that the first region and the second region form a first pn-junction of the vertical thyristor structure.

In Example 32 the vertical thyristor structure of Example 31 may optionally include that the first region and at least one of the first semiconductor layer or the second semiconductor layer forms a second pn-junction of the vertical thyristor structure.

In Example 33 the vertical thyristor structure of Example 32 may optionally include that the second semiconductor layer and the third semiconductor layer form a third pn-junction of the vertical thyristor structure.

In Example 34 the vertical thyristor structure of any one of Examples 30 to 33 may optionally include that the second region extends from the surface of the first semiconductor layer into the first region.

In Example 35 the vertical thyristor structure of any one of Examples 30 to 34 may optionally include that the second semiconductor layer has a dopant concentration greater than a dopant concentration of the first semiconductor layer.

In Example 36 the vertical thyristor structure of any one of Examples 30 to 35 may optionally include that a portion of the first semiconductor layer is disposed between the first region and the second semiconductor layer.

In Example 37 the vertical thyristor structure of Example 36 may optionally further include: a third region disposed between the first region and the second semiconductor layer, wherein the third region is doped with a dopant of the first doping type, wherein a dopant concentration of the third region is greater than a dopant concentration of the portion of the first semiconductor layer.

In Example 38 the vertical thyristor structure of Example 37 may optionally include that the third region adjoins the second semiconductor layer.

In Example 39 the vertical thyristor structure of Example 37 or 38 may optionally include that the portion of the first semiconductor layer forms a first portion of the second pn-junction and wherein the third region forms a second portion of the second pn-junction.

In Example 40 the vertical thyristor structure of any one of Examples 30 to 39 may optionally include that the isolation structure completely laterally surrounds the first region.

In Example 41 the vertical thyristor structure of any one of Examples 30 to 40 may optionally include that the isolation structure has a depth that is similar to a depth of the first region.

In Example 42 the vertical thyristor structure of any one of Examples 30 to 41 may optionally include that the third semiconductor layer is a single crystalline semiconductor substrate and wherein the first semiconductor layer and the second semiconductor layer are epitaxial layers grown on the single crystalline semiconductor substrate.

In Example 43 the vertical thyristor structure of any one of Examples 30 to 42 may optionally further include: a first contact region disposed in the first region, wherein the first contact region is doped with a dopant of the second doping type.

In Example 44 the vertical thyristor structure of Example 43 may optionally further include: a first metallization structure electrically contacting the second region and the first contact region.

In Example 45 the vertical thyristor structure of any one of Examples 30 to 44 may optionally further include: a second metallization structure electrically contacting the third semiconductor layer.

In Example 46 the vertical thyristor structure of Example 45 may optionally include that the second metallization structure further electrically contacts the second semiconductor layer.

In Example 47 the vertical thyristor structure of any one of Examples 30 to 46 may optionally include that the isolation structure includes a first material having a first relative permittivity and wherein the first semiconductor layer includes a second material having a second relative permittivity, wherein the first relative permittivity is less than the second relative permittivity.

In Example 48 the vertical thyristor structure of Example 47 may optionally include that the second material is silicon.

In Example 49 the vertical thyristor structure of Example 47 or 48 may optionally include that the first material is silicon oxide.

Example 50 is a method for manufacturing a vertical thyristor structure, the method including: forming a layer stack, the layer stack including a first semiconductor layer doped with a dopant of a first doping type, a second semiconductor layer doped with a dopant of the first doping type, and a third semiconductor layer doped with a dopant of a second doping type opposite the first doping type, wherein the first semiconductor layer is disposed over the second semiconductor layer and wherein the second semiconductor layer is disposed over the third semiconductor layer, forming an isolation structure into the first semiconductor layer, the isolation structure extending from a surface of the first semiconductor layer into the first semiconductor layer, wherein the isolation structure laterally surrounds a first region; and doping the first region with a dopant of the second doping type using the isolation structure as a doping mask.

Example 51 is an electrostatic discharge protection structure including: a carrier including a first semiconductor layer, wherein the first semiconductor layer is doped with a dopant of a first doping type, a first region extending from a surface of the first semiconductor layer into the first semiconductor layer, wherein the first region is doped with a dopant of a second doping type opposite the first doping type; an isolation structure extending from the surface of the first semiconductor layer into the first semiconductor layer and laterally separating the first region from the first semiconductor layer; a second region doped with a dopant of the first doping type and disposed within the first region to form a first pn-junction; a second semiconductor layer disposed within the carrier and doped with a dopant of the first doping type, and a third semiconductor layer disposed within the carrier and doped with a dopant of the second doping type, wherein the second semiconductor layer is disposed at least between the first region and the third semiconductor layer to form a second pn-junction with the first region and to form a third pn-junction with the third semiconductor layer, wherein the first pn-junction, the second pn-junction, and the third pn-junction providing a vertical thyristor structure.

In Example 52 the electrostatic discharge protection structure of Example 51 may optionally include that the second semiconductor layer includes a first portion having a first dopant concentration and a second portion having a second dopant concentration greater than the first dopant concentration.

In Example 53 the electrostatic discharge protection structure of Example 52 may optionally include that the first portion of the second semiconductor layer adjoins the first region to form the second pn-junction.

In Example 54 the electrostatic discharge protection structure of Example 52 or 53 may optionally include that the second portion of the second semiconductor layer adjoins the third semiconductor layer to form the third pn-junction.

In Example 55 the electrostatic discharge protection structure of Example 52 may optionally further include: a doped region disposed between the second portion of the second semiconductor layer and the first region, wherein the doped region is doped with a dopant of the first doping type, wherein a dopant concentration of the doped region is greater than a dopant concentration of the first portion of the second semiconductor layer.

In Example 56 the electrostatic discharge protection structure of Example 55 may optionally include that the first portion of the second semiconductor layer adjoins the first region to form a first portion of the second pn-junction and that the doped region adjoins the first region to form a second portion of the second pn-junction.

In Example 57 the electrostatic discharge protection structure of Example 55 or 56 may optionally include that the doped region adjoins the second portion of the second semiconductor layer.

In Example 58 the electrostatic discharge protection structure of Example 57 may optionally include that the second portion of the second semiconductor layer adjoins the third semiconductor layer to form the third pn-junction.

In Example 59 the electrostatic discharge protection structure of any one of Examples 51 to 58 may optionally include that the isolation structure includes a first material having a first relative permittivity and that the first semiconductor layer includes a second material having a second relative permittivity, wherein the first relative permittivity is less than the second relative permittivity.

In Example 60 the electrostatic discharge protection structure of Example 59 may optionally include that the second material is silicon.

In Example 61 the electrostatic discharge protection structure of Example 59 or 60 may optionally include that the first material is silicon oxide.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:
1. An electrostatic discharge protection structure comprising:
   a semiconductor layer doped with a dopant of a first doping type;

a first well region extending from a surface of the semiconductor layer into the semiconductor layer, wherein the first well region is doped with a dopant of a second doping type opposite the first doping type;

a second well region next to the first well region and extending from the surface of the semiconductor layer into the semiconductor layer, wherein the second well region is doped with a dopant of the first doping type; and an isolation structure extending from the surface of the semiconductor layer into the semiconductor layer with a depth similar to a depth of at least one of the first well region or the second well region, wherein the isolation structure is arranged laterally adjacent to the first well region and the second well region, wherein the isolation structure comprises at least one continuous isolation structure element having a first sidewall contacting a sidewall of the first well region and a second sidewall contacting a sidewall of the second well region, and wherein the isolation structure is segmented to provide at least one continuous trigger region having a first sidewall contacting the sidewall of the first well region and a second sidewall contacting the sidewall of the second well region.

2. The electrostatic discharge protection structure of claim 1, wherein the at least one trigger region is disposed between at least two portions of the isolation structure.

3. The electrostatic discharge protection structure of claim 1, wherein the isolation structure laterally surrounds the first well region and the second well region.

4. The electrostatic discharge protection structure of claim 1, wherein the isolation structure comprises a first material having a first relative permittivity and wherein the semiconductor layer comprises a second material having a second relative permittivity, wherein the first relative permittivity is less than the second relative permittivity.

5. The electrostatic discharge protection structure of claim 4, wherein the second material is silicon.

6. The electrostatic discharge protection structure of claim 1, further comprising:
a first doped region disposed within the first well region and doped with a dopant of the first doping type; and
a second doped region disposed within the second well region and doped with a dopant of the second doping type, wherein the first doped region, the second doped region, the first well region, and the second well region are arranged relative to each other as a lateral thyristor structure.

7. The electrostatic discharge protection structure of claim 6, further comprising:
a first contact region disposed in the first well region, wherein the first contact region is doped with a dopant of the second doping type; and
a second contact region disposed in the second well region, wherein the second contact region is doped with a dopant of the first doping type.

8. The electrostatic discharge protection structure of claim 7, further comprising:
a first metallization structure electrically contacting the first doped region and the first contact region; and
a second metallization structure electrically contacting the second doped region and the second contact region.

9. The electrostatic discharge protection structure of claim 1, further comprising:
a semiconductor substrate layer, wherein the semiconductor substrate layer is doped with a dopant of the first doping type and wherein the semiconductor layer is an epitaxial layer grown on the semiconductor substrate layer, wherein a dopant concentration of the semiconductor substrate layer is greater than a dopant concentration of the semiconductor layer; and
a vertical breakdown region disposed between the first well region and the semiconductor substrate layer, wherein the vertical breakdown region is doped with a dopant of the second doping type.

10. An electronic device comprising:
the electrostatic discharge protection structure according to claim 1; and
an electronic circuit coupled to the electrostatic discharge protection structure, wherein the electrostatic discharge protection structure is configured to protect the electronic circuit from an electrostatic discharge event.

* * * * *